(12) United States Patent
Kuo et al.

(10) Patent No.: US 12,191,265 B2
(45) Date of Patent: Jan. 7, 2025

(54) ANTENNA APPARATUS AND METHOD

(71) Applicant: Taiwan Semiconductor Manufacturing Co., Ltd., Hsinchu (TW)

(72) Inventors: Feng-Wei Kuo, Zhudong Township (TW); Wen-Shiang Liao, Toufen Township (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/366,282

(22) Filed: Aug. 7, 2023

(65) Prior Publication Data

US 2023/0387049 A1    Nov. 30, 2023

Related U.S. Application Data

(62) Division of application No. 17/314,368, filed on May 7, 2021, now Pat. No. 11,961,809.

(Continued)

(51) Int. Cl.
*H01L 23/66* (2006.01)
*H01L 21/48* (2006.01)
(Continued)

(52) U.S. Cl.
CPC .......... *H01L 23/66* (2013.01); *H01L 21/4853* (2013.01); *H01L 21/4857* (2013.01);
(Continued)

(58) Field of Classification Search
CPC . H01L 23/66; H01L 23/5383; H01L 23/5386; H01L 23/5389; H01L 23/49816;
(Continued)

(56) References Cited

U.S. PATENT DOCUMENTS 9,064,718 B1    6/2015   Muniandy et al.
2017/0162524 A1   6/2017   Wang et al.
(Continued)

FOREIGN PATENT DOCUMENTS

| | | |
|---|---|---|
| CN | 111403354 A | 7/2020 |
| CN | 111403355 A | 7/2020 |
| TW | 202036792 A | 10/2020 |

OTHER PUBLICATIONS

Gonon et al., "Dielectric properties of epoxy/silica composites used for microlectronic packaging, and their dependence on post-curing," Journal of Materials Science, Materials in Electronics 12, 2001, pp. 81-86.

*Primary Examiner* — Kyoung Lee
*Assistant Examiner* — Christina A Sylvia
(74) *Attorney, Agent, or Firm* — Slater Matsil, LLP

(57) ABSTRACT

A package structure includes a first die, a second die over and electrically connected to the first die, an insulating material around the second die, a first antenna extending through the insulating material and electrically connected to the second die, the first antenna being adjacent to a first sidewall of the second die, wherein the first antenna includes a first conductive plate extending through the insulating material, and a plurality of first conductive pillars extending through the insulating material, wherein the first conductive plate is between the plurality of first conductive pillars and the first sidewall of the second die.

20 Claims, 32 Drawing Sheets

Related U.S. Application Data

(60) Provisional application No. 63/154,034, filed on Feb. 26, 2021.

(51) Int. Cl.
| | | |
|---|---|---|
| *H01L 23/00* | (2006.01) | |
| *H01L 23/538* | (2006.01) | |
| *H01Q 1/22* | (2006.01) | |
| *H01Q 9/04* | (2006.01) | |

(52) U.S. Cl.
CPC ...... *H01L 23/5383* (2013.01); *H01L 23/5386* (2013.01); *H01L 23/5389* (2013.01); *H01L 24/19* (2013.01); *H01L 24/20* (2013.01); *H01Q 1/2283* (2013.01); *H01Q 9/0407* (2013.01); *H01L 2223/6677* (2013.01); *H01L 2224/214* (2013.01)

(58) Field of Classification Search
CPC ............. H01L 23/5385; H01L 23/3107; H01L 23/585; H01L 23/29; H01L 23/485; H01L 23/528; H01L 21/4853; H01L 21/4857; H01L 24/19; H01L 24/20; H01L 24/32; H01L 24/48; H01L 24/08; H01L 24/73; H01L 24/92; H01L 2223/6677; H01L 2224/214; H01L 2224/04105; H01L 2224/0603; H01L 2224/06181; H01L 2224/08145; H01L 2224/12105; H01L 2224/24137; H01L 2224/32145; H01L 2224/32225; H01L 2224/48227; H01L 2224/73201; H01L 2224/73251; H01L 2224/73265; H01L 2224/73267; H01L 2224/9212; H01L 2224/9222; H01L 25/0657; H01L 25/105; H01L 2225/0651; H01L 2225/06548; H01L 2225/06568; H01L 2225/1035; H01L 2225/1041; H01L 2225/1058; H01Q 1/2283; H01Q 1/28; H01Q 1/241; H01Q 9/0407
See application file for complete search history.

(56) References Cited

U.S. PATENT DOCUMENTS

| | | |
|---|---|---|
| 2018/0025999 A1 | 1/2018 | Yu et al. |
| 2018/0076142 A1 | 3/2018 | Shim et al. |
| 2018/0082964 A1 | 3/2018 | Wu et al. |
| 2018/0247915 A1 | 8/2018 | Kinsley |
| 2019/0006309 A1 | 1/2019 | Jeng et al. |
| 2019/0019756 A1* | 1/2019 | Yu ................. H01L 23/66 |
| 2019/0103653 A1 | 4/2019 | Jeong et al. |
| 2019/0355694 A1* | 11/2019 | Wan .............. H01L 21/568 |
| 2020/0295453 A1 | 9/2020 | Kuo et al. |
| 2020/0365477 A1 | 11/2020 | Moitzi et al. |
| 2021/0098860 A1 | 4/2021 | Kuo et al. |
| 2022/0368012 A1 | 11/2022 | Kuo et al. |
| 2022/0407216 A1 | 12/2022 | Dogiamis et al. |

\* cited by examiner

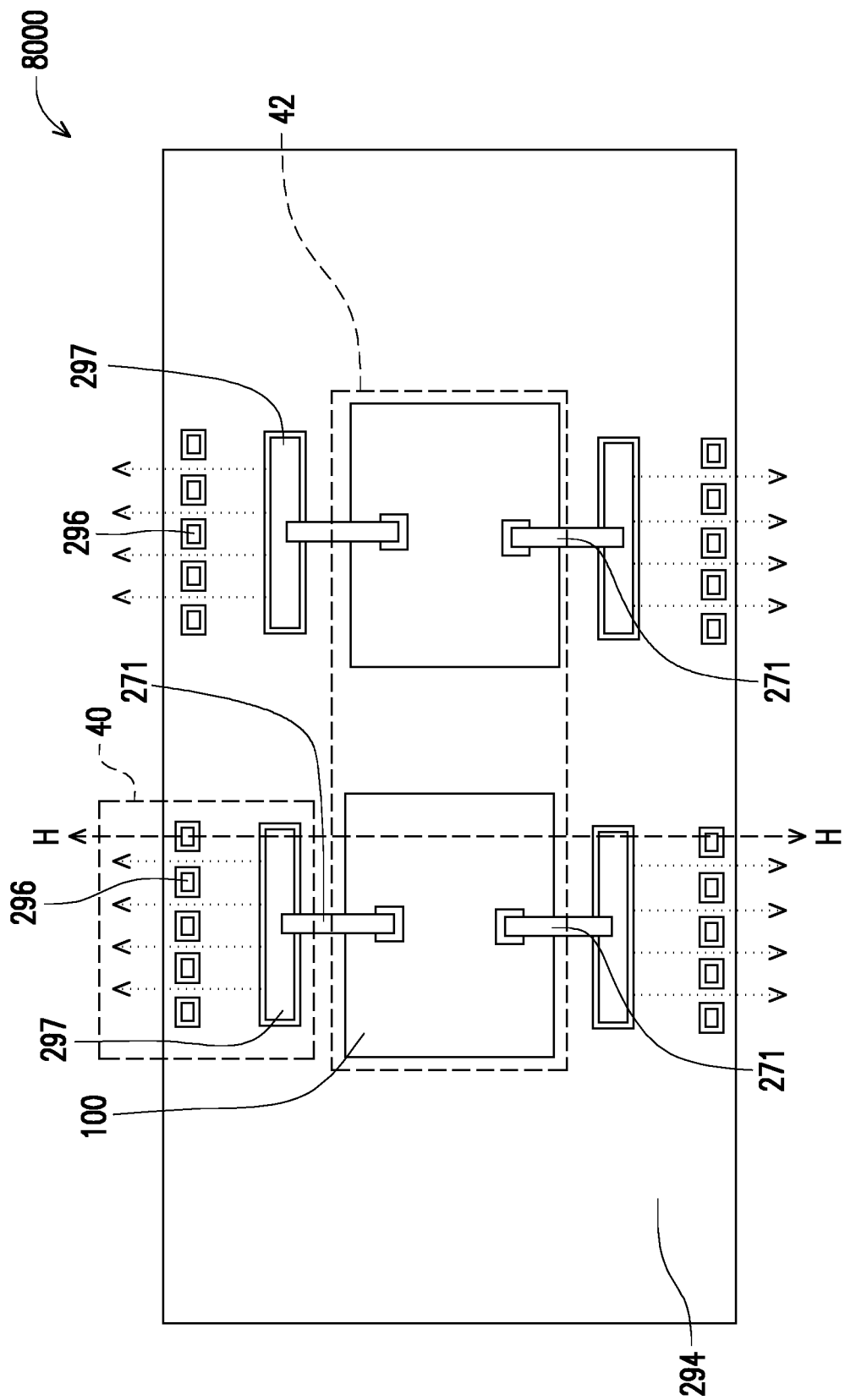

ANTENNA APPARATUS AND METHOD

PRIORITY CLAIM AND CROSS-REFERENCE

This patent application is a divisional of U.S. application Ser. No. 17/314,368, filed on May 7, 2021, which claims priority to U.S. Provisional Application No. 63/154,034, filed on Feb. 26, 2021 and entitled "Chiplet System Integration with Embedded Antenna and Manufacturing Method Thereof," which application is hereby incorporated by reference herein as if reproduced in its entirety.

BACKGROUND

In modern semiconductor devices and systems, integration and miniaturization of components have progressed at an increasingly rapid pace. In wireless applications, one of the growing challenges encountered by the integration process is the disposition of radio frequency devices or antennas. Conventional antennas associated with integrated circuits are usually designed with limited performance and capability due to the competing objective of size reduction. Thus, an improved integrated antenna structure is desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 17A and 17B illustrates a top-view and a cross-sectional view of a package 8000 in accordance with an alternate embodiment.

DETAILED DESCRIPTION

Figure 1:
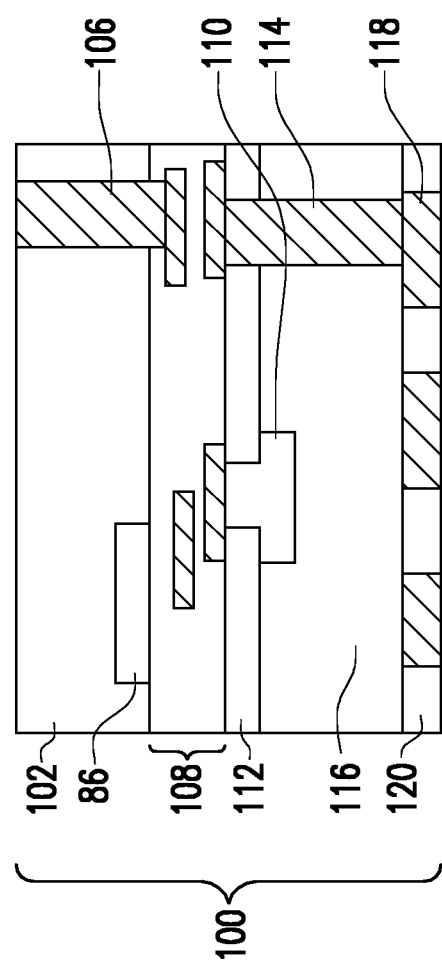
FIGS. 1 through 10 illustrate cross-sectional views and a top-view of intermediate steps during a process for forming a package 1000 in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide methods applied to, but not limited to, the formation of a system on integrated chip (SoIC) package comprising vertical Through Dielectric Via (TDV) walls and TDV gratings to form an antenna oscillation cavity. The TDV walls and TDV gratings can be formed having varied heights and varied widths. In addition, the spacing between two adjacent vertical TDV walls may be varied, and the spacing between two adjacent vertical TDV gratings may also be varied. Advantageous features of one or more embodiments disclosed herein may allow for high-frequency lateral Radio Frequency (RF) transmission suitable for 5G & 6G high-frequency (e.g., 29, 38, 77, and 120 GHz) RF transceivers, as well as portable, wearable, IoT (internet of things) and smart phone products. In addition, the thin plated TDV walls and TDV gratings can act as an embedded SoIC high-frequency RF emission and receiving antenna structures. Further, because the formation process of the TDV walls and the TDV gratings is compatible with current processes, manufacturing costs are reduced and efficiency is increased.

Figure 8:
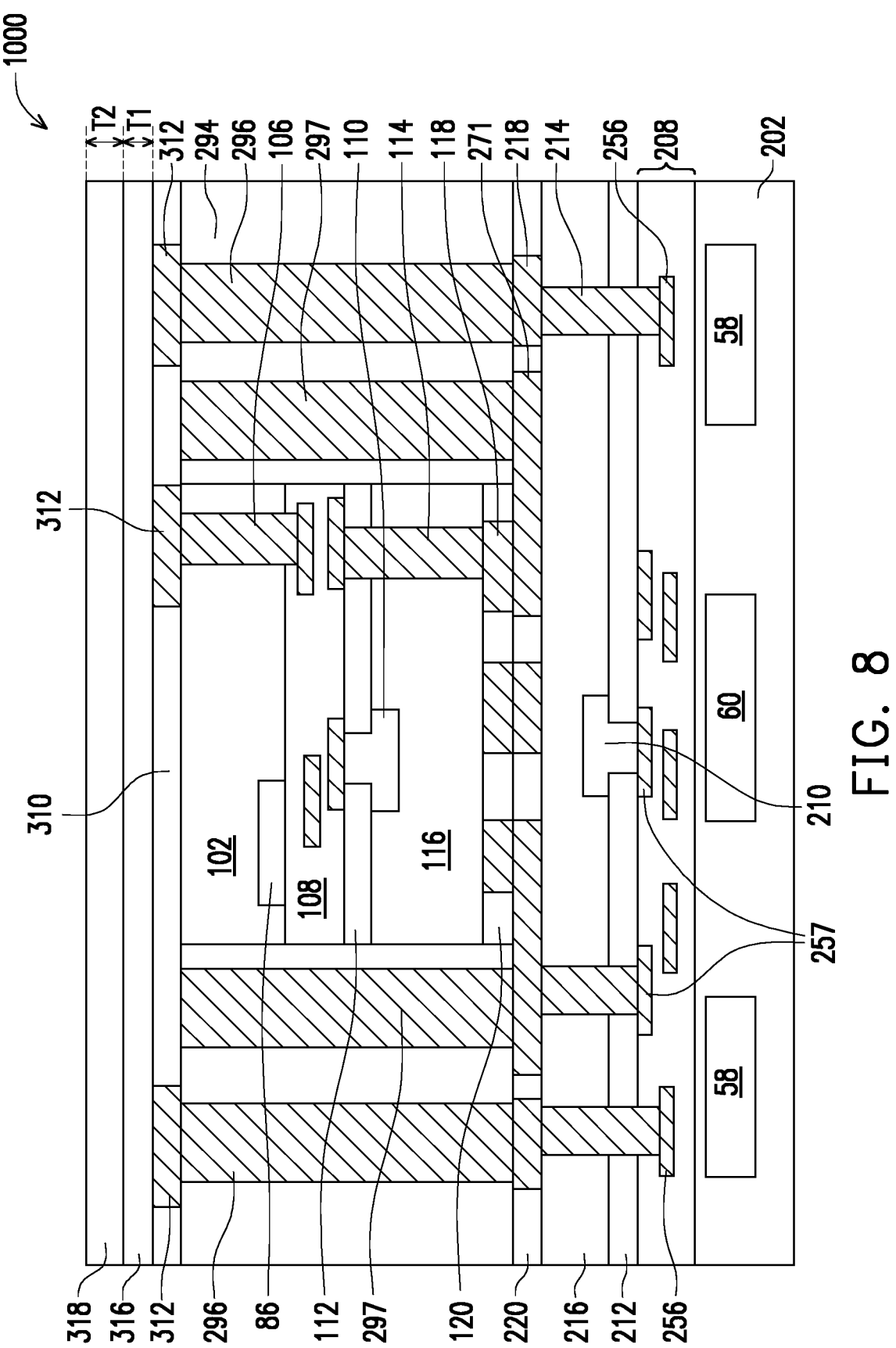
Figure 9:
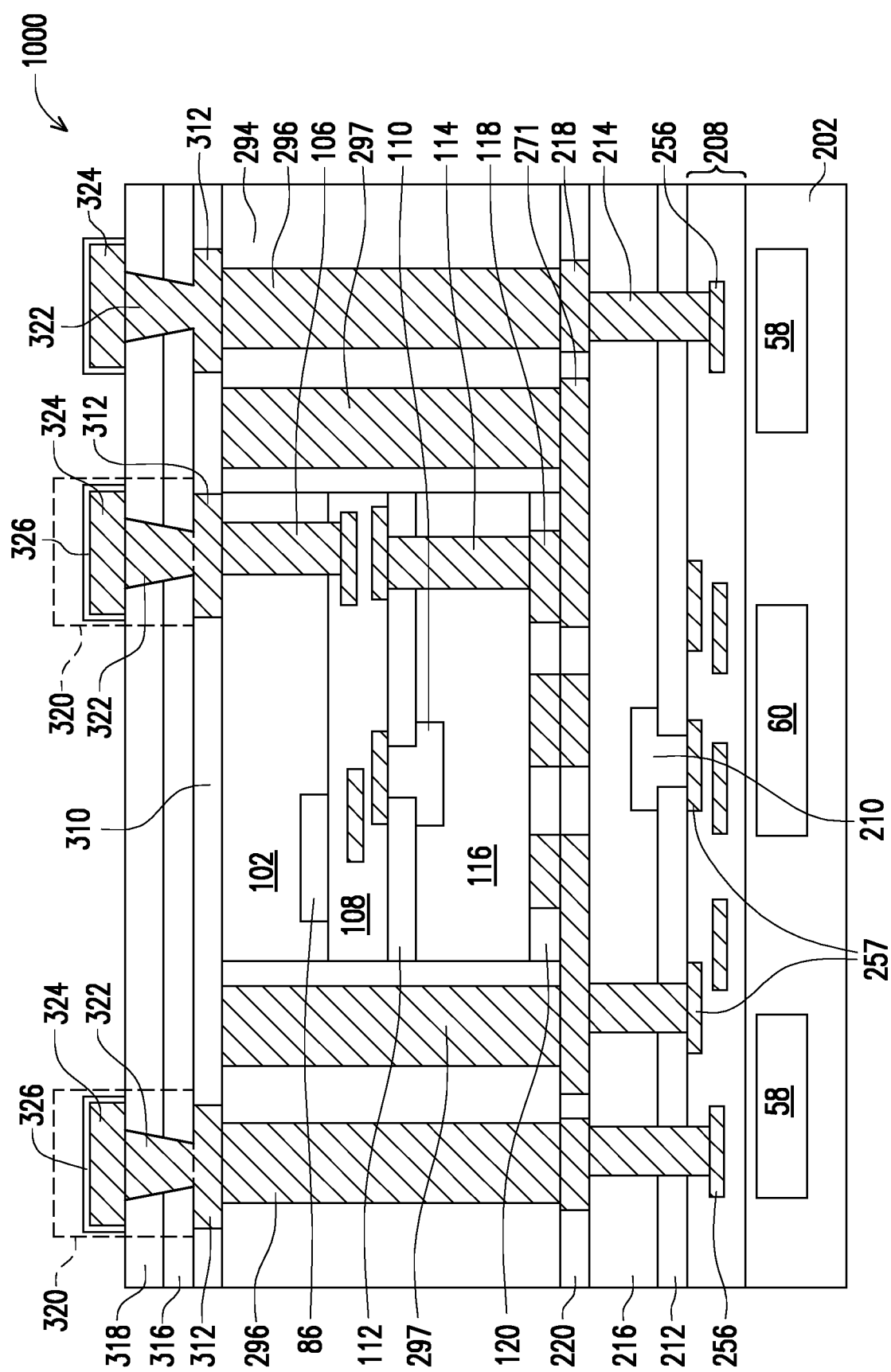
Figure 10:
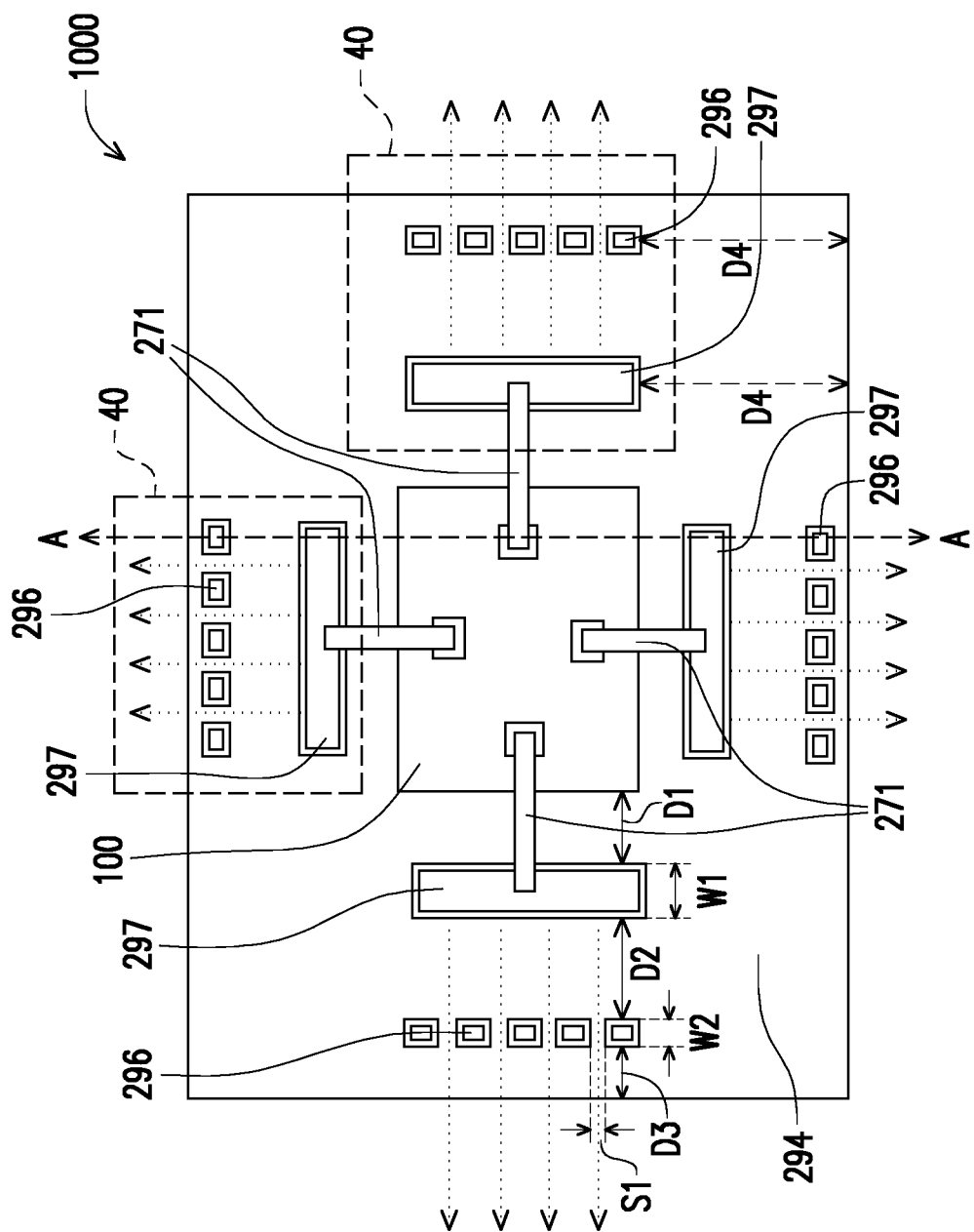

FIGS. 1 through 10 show cross-sectional views and a top-view of intermediate stages in the manufacturing of a package 1000 that reference cross-section A-A illustrated in FIG. 10, in accordance with some exemplary embodiments. FIGS. 11A through 22 show cross-sectional views and top-views of packages, in accordance with alternate embodiments. FIG. 23 shows a schematic diagram of a simulation result for different insulating materials, in accordance with some embodiments.

Referring to FIG. 1, a die 100 is illustrated. FIG. 1 illustrates a detailed cross-sectional view of an embodiment die 100 and may be referenced herein for clarity. The die 100 may be a bare chip semiconductor die (e.g., unpackaged semiconductor die). For example, the die 100 may be a logic die (e.g., application processor (AP), central processing unit, microcontroller, etc.), memory die (e.g., dynamic random access memory (DRAM) die, hybrid memory cube (HBC), static random access memory (SRAM) die, a wide input/output (wideIO) memory die, magnetoresistive random access memory (mRAM) die, resistive random access memory (rRAM) die, etc.), power management die (e.g., power management integrated circuit (PMIC) die), radio frequency (RF) die, baseband transceiver die, sensor die, micro-electro-mechanical-system (MEMS) die, signal processing die (e.g., digital signal processing (DSP) die), front-end die (e.g., analog front-end (AFE) dies), biomedical die, combinations thereof, or the like.

The die 100 may be processed according to applicable manufacturing processes to form integrated circuits in the die 100. For example, the die 100 may include a substrate 102, such as silicon, doped or undoped, or an active layer of a semiconductor-on-insulator (SOI) substrate. The substrate 102 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the substrate 102 and may be interconnected by an interconnect structure 108 comprising, for example, metallization patterns in one or more dielectric layers on the substrate 102. The interconnect structure 108 and the devices on the substrate 102 are electrically connected to form one or more integrated circuits.

The die 100 may further include a through substrate via (TSV) 106, which may be electrically connected to the metallization patterns in the interconnect structure 108. The TSV 106 may comprise a conductive material (e.g., copper) and may extend from the interconnect structure 108 into the substrate 102. Insulating barrier layers (not explicitly illustrated) may be formed around at least portions of the TSV 106 in the substrate 102. The insulating barrier layers may comprise, for example, silicon oxide, silicon nitride, silicon oxynitride, or the like, and may be used to physically and electrically isolate the TSV 106 from the substrate 102. In subsequent processing steps, the substrate 102 may be thinned to expose the TSV 106. After thinning, the TSV 106 provides electrical connection from a back side of the substrate 102 to a front side of the substrate 102.

The die 100 may further comprise a contact pad 110 to which external connections are made to the interconnect structure 108 and the devices. The contact pad 110 may comprise copper, aluminum (e.g., 28K aluminum), or another conductive material. As illustrated in FIG. 1, the contact pad 110 is disposed on what may be referred to as an active side or front side of the die 100. The active side/front side of the die 100 may refer to a side of the substrate 102 on which the active devices are formed. The back side of the die 100 may refer to a side of the substrate 102 opposite the active side/front side.

A passivation film 112 is disposed on the interconnect structure 108, and the contact pad 110 is exposed at a top surface of the passivation film 112. The passivation film 112 may comprise silicon oxide (e.g., SiO$_2$), silicon oxynitride, silicon nitride, or the like. In some embodiments, the contact pad 110 may extend above a top surface of the passivation film 112.

The die 100 may be formed as part of a larger wafer (e.g., connected to each other and other dies). Subsequently, the dies may be singulated from each other and from other features of the wafer. The singulation process may include mechanical sawing, laser dicing, plasma dicing, combinations thereof, or the like.

After the singulation process, a chip probe (CP) test may be applied to each die (e.g., using the contact pad 110). The CP test checks electrical functionality of each die and a die that passes the CP tests is referred to as a known good die (KGD). A die that does not pass the CP tests is discarded or repaired.

A bonding layer 120 is formed over the contact pad no and the interconnect structure 108 of each KGD. The bonding layer 120 may comprise any material that is capable of forming a dielectric-to-dielectric bond. For example the bonding layer 120 may comprise silicon oxide (e.g., SiO$_2$), silicon oxynitride, silicon nitride, or the like. Contact pads 118 may be disposed in the bonding layer 120 and exposed at the front surface of the die 100. The contact pads 118 may be electrically connected to conductive vias 114 which extend through a dielectric layer 116. The dielectric layer 116 may comprise tetraethyl orthosilicate (TEOS), or the like, and the dielectric layer 116 may surround and cover the contact pad no to provide a planar surface on which to form the bonding layer 120.

Figure 2:
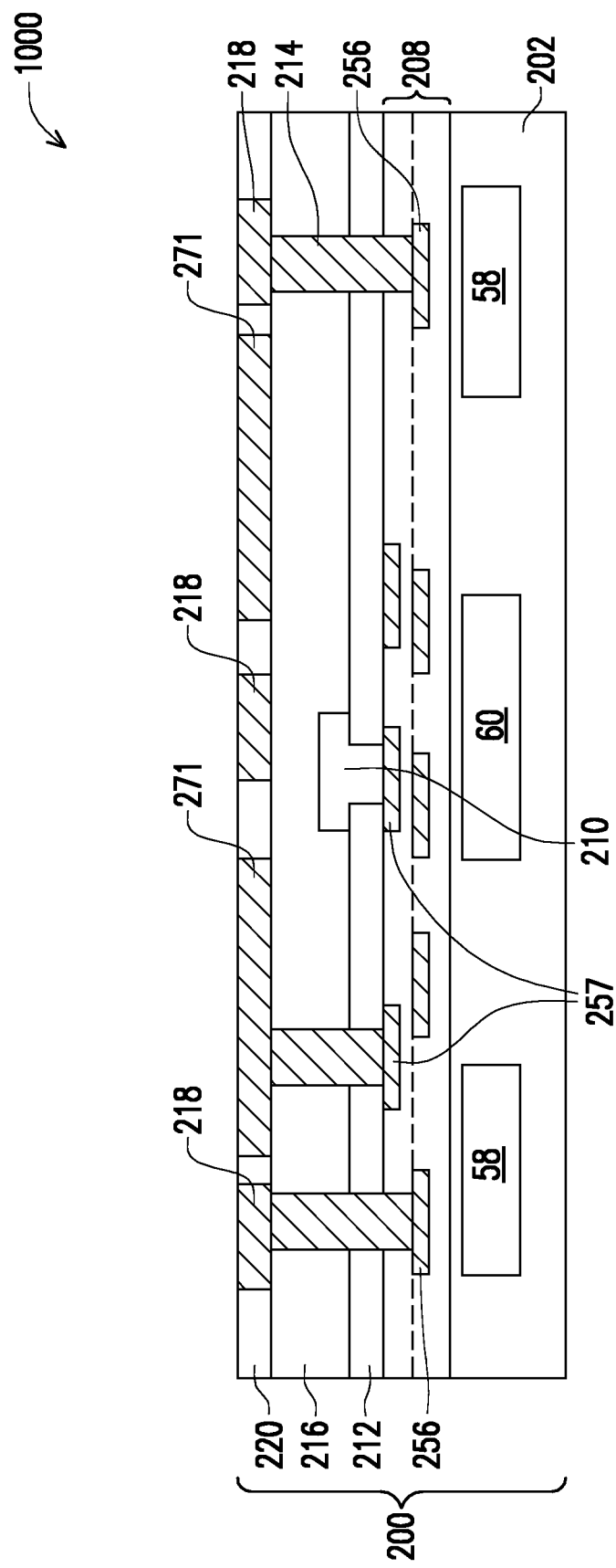

FIG. 2 illustrates a bottom die 200. The bottom die 200 may have a structure similar to what is described for the die 100 unless specified otherwise, and the details are not repeated herein. The materials of the features in the bottom die 200 may be found by referring to the like features in the die 100, with the like features in the die 100 starting with number "1," which features correspond to the features in the bottom die 200 and having reference numerals starting with number "2."

Still referring to FIG. 2, the bottom die 200 may include one or more devices 58/60, which may be designed for an intended purpose such as a logic die, a central processing unit (CPU) die, a system-on-a-chip (SoC), a field programmable gate array (FPGA), a graphics processing unit (GPU), a neural processing unit (NPU), the like, or a combination thereof, which may be used in applications relating to 5G, artificial intelligence (AI), internet of things (IoT), car radars and high performance computing (HPC). In an embodiment, the bottom die 200 includes integrated circuit devices, such as transistors, capacitors, inductors, resistors, metallization layers, conductive connectors, and the like, therein, as desired for a particular functionality. In some embodiments, the bottom die 200 may include more than one of the same type of device, or may include different devices. For example, the bottom die 200 may comprise one or more devices 58, which provide one or more baseband blocks (e.g., that may be used to process digital data into radio frequency signals) and one or more additional devices 60. Each of the devices 60 may be designed for an intended purpose such as a SOC, HPC, NPU or AI.

The metallization pattern in the interconnect structure 208 of the bottom die 200 may include one or more ground lines 256 and signal lines 257, for example. In an embodiment, the ground lines 256 may be electrically connected to TDV gratings 296 (shown subsequently in FIG. 6), which are electrically grounded through conductive connectors 320 (shown subsequently in FIG. 9). The bottom die 200 may be formed as part of a larger wafer (e.g., connected to each other and other bottom dies 200). After various features are formed in the bottom die 200, a thinning process may be applied to thin the bottom die 200.

A bonding layer 220 is formed over the contact pad 210 and the interconnect structure 208 of each KGD. The bonding layer 220 may by similar to the bonding layer 120. Conductive features (e.g., contact pads 218 and feed lines 271) may be disposed in the bonding layer 220 and exposed at the front surface of the bottom die 200. The conductive features in the bonding layer 220 may be electrically connected to ground lines 256 and signal lines 257 of the interconnect structure 208 by, for example, conductive vias 214 which extend through a dielectric layer 216. The dielectric layer 216 may comprise TEOS, or the like, and the dielectric layer 216 may be formed around and over contact pads 210 to provide a planar surface on which to form the bonding layer 220.

Figure 3:
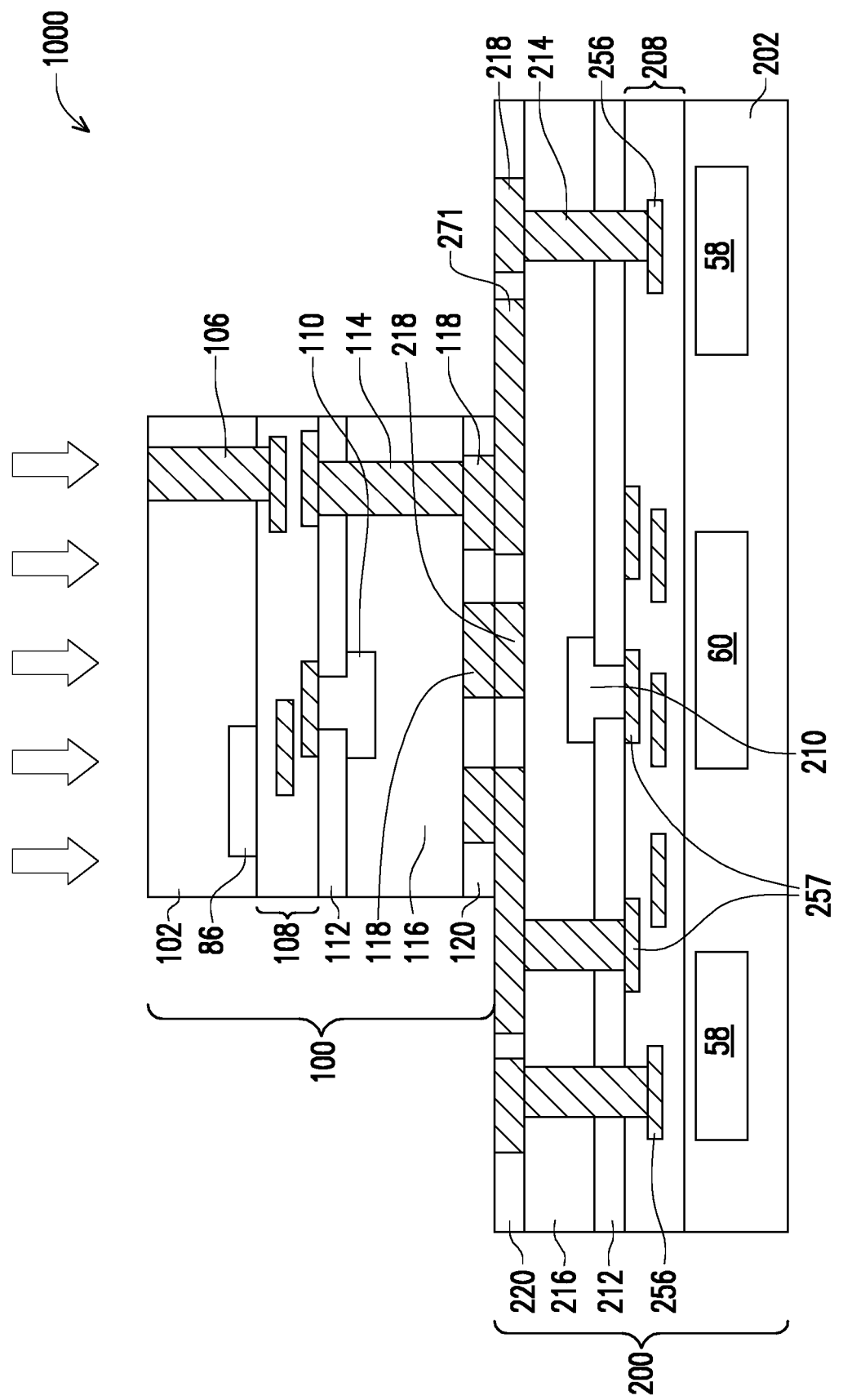

In FIG. 3, the bottom die 200 is bonded to the die 100, for example, using a hybrid bonding process. As illustrated by FIG. 3, the hybrid bonding process directly bonds the bonding layer 220 of the bottom die 200 to the bonding layer 120 of the die 100 through fusion bonding. In an embodiment, the bond between the bonding layer 220 and the bonding layer 120 may be an oxide-to-oxide bond. The hybrid bonding process further directly bonds the contact pads 218 and the feed lines 271 of the bottom die 200 to the contact pads 118 of the die 100 through direct metal-to-metal bonding. Thus, the die 100 and the bottom die 200 are electrically connected.

As an example hybrid bonding process starts with aligning the die 100 with the bottom die 200, for example, by aligning the contact pads 218 and the feed lines 271 to the contact pads 118. When the die 100 and the bottom die 200 are aligned, the contact pads 218 and the feed lines 271 may overlap with the corresponding contact pads 118. Next, the hybrid bonding includes a pre-bonding step, during which the die 100 is put in contact with the bottom die 200. The hybrid bonding process continues with performing an anneal, for example, at a temperature between about 100° C. and about 450° C. for a duration between about 0.5 hours and about 3 hours, so that the copper in the contact pads 118, the contact pads 218, and the feed lines 271 inter-diffuses to each other, and hence the direct metal-to-metal bonding is formed.

Figure 4:
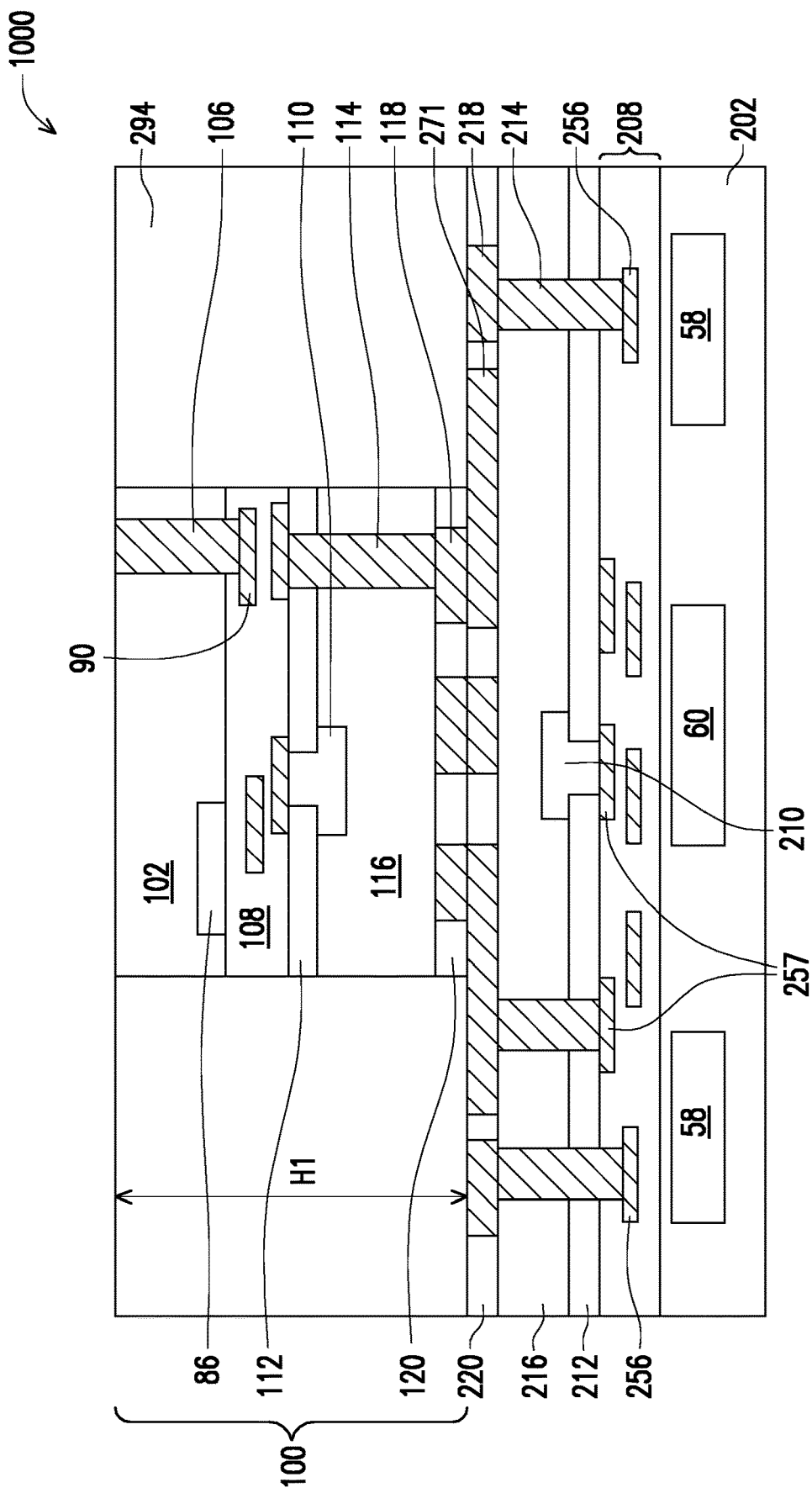

In FIG. 4, insulating material 294 is formed over the die 100 and the bottom die 200. The insulating material 294 may comprise a dielectric material such as a silicon oxide, or the like, formed by any oxidation process, such as CVD or PECVD techniques using tetra-ethyl-Ortho-silicate (TEOS) and oxygen as a precursor. A planarization step such as CMP, or the like, may be performed to level top surfaces of the insulating material 294 with a top surface of the die 100. The planarization step may further expose the TSVs 106 of the die 100. In an embodiment, a height H1 of the die 100 may be in a range from 20 µm to 775 µm after the planarization step. In an embodiment, the dielectric constant of the insulating material 294 may be in a range from 3.9 to 4.2.

Figure 5:
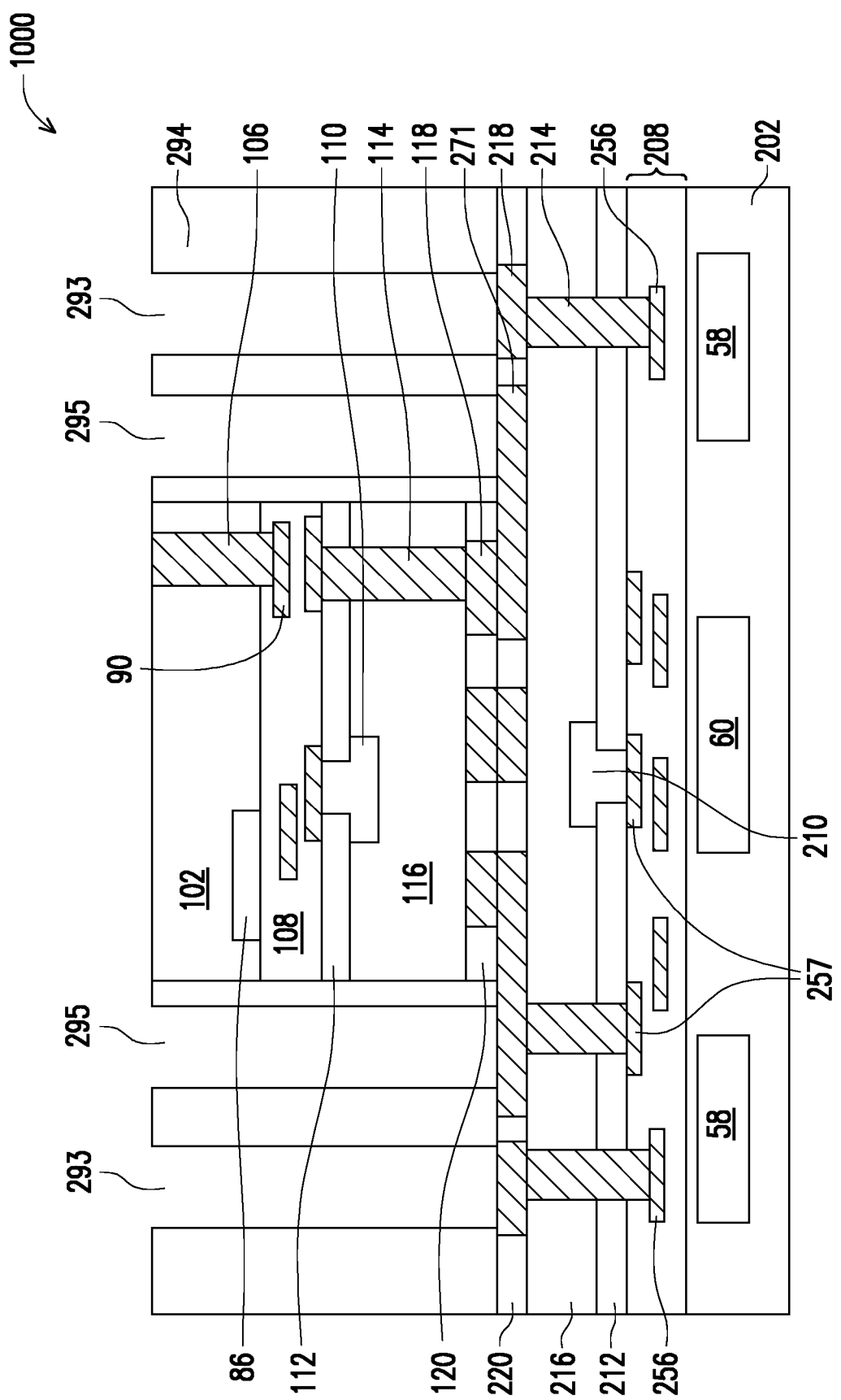

In FIG. 5, first openings 293 are formed through the insulating material 294 to expose the contact pads 218, and second openings 295 are formed through the insulating material 294 to expose the feed lines 271 of the bottom die 200 using photolithography and one or more etch processes, for example. The etch process may be a dry etch and may include an inductively coupled plasma (ICP) etch, reactive ion etch (RIE), neutral beam etch (NBE), the like, or a combination thereof. The etch process may be anisotropic. In some embodiments, the etching process can include plasma using a first gas comprising carbon tetrafluoride ($CF_4$), methane ($CH_4$), hexafluoroethane ($C_2F_6$), octafluoropropane ($C_3F_8$), the like, or a combination thereof. The plasma can further use a second gas comprising nitrogen ($N_2$), hydrogen ($H_2$), oxygen ($O_2$), argon (Ar), xenon (Xe), helium (He), the like, or a combination thereof. An inert gas may be optionally supplied during the etching process.

Figure 6:
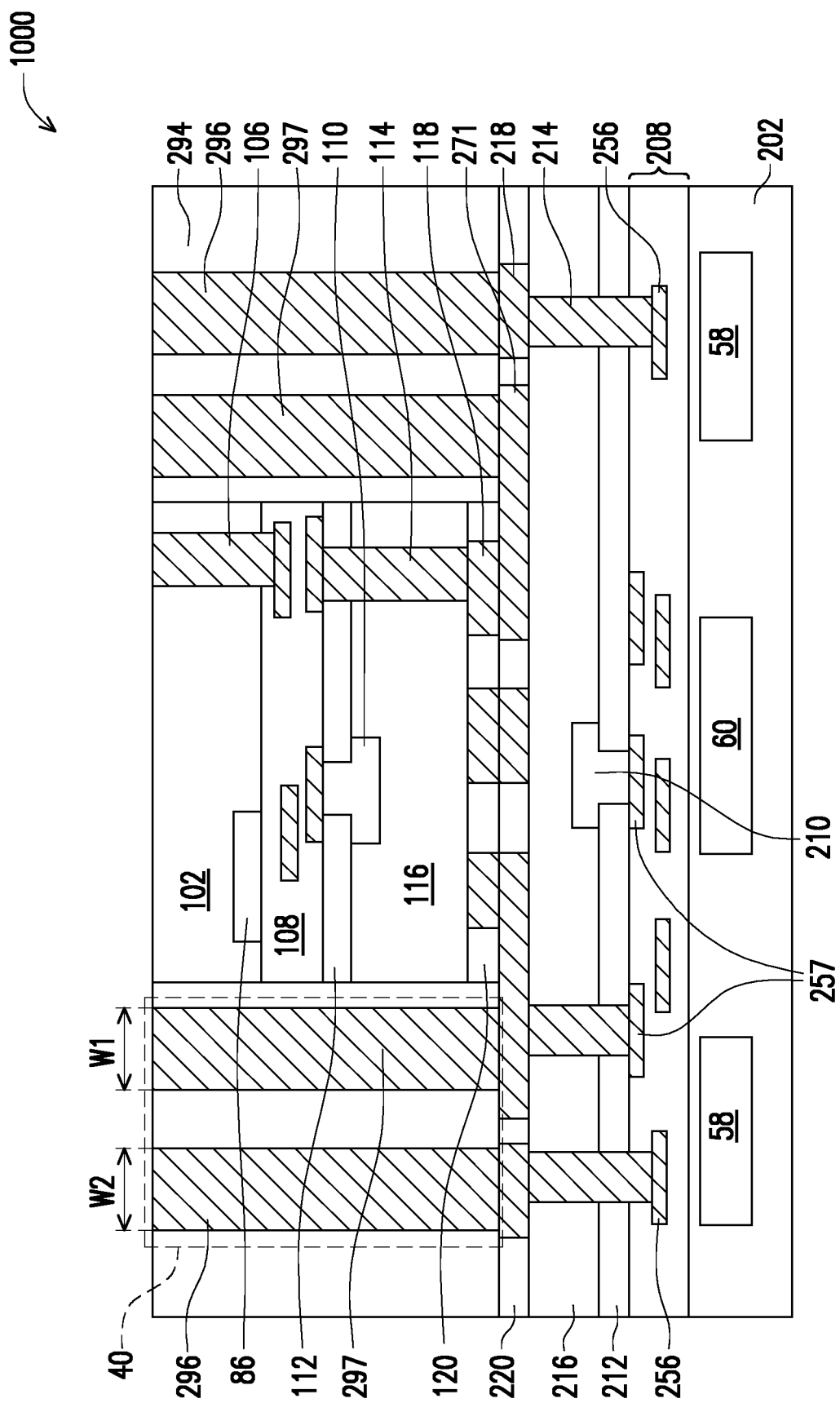

In FIG. 6, a seed layer (not shown) is deposited into the first openings 293 and the second openings 295. The seed layer may be blanket deposited over top surfaces of the insulating layer 294, a top surface of the die 100, sidewalls of the first openings 293 and the second openings 295, and bottom surfaces of the first openings 293 and the second openings 295. The seed layer may comprise a conductive material, such as copper, titanium, or the like and may be deposited using processes such as sputtering, evaporation, CVD, plasma-enhanced chemical vapor deposition (PECVD), a plating process, an electroless plating process, or the like. A conductive material may then be deposited over the seed layer to fill the first openings 293 and the second openings 295 through a plating process, electroless plating process CVD, PECVD, or the like. The conductive material may be a metal such as copper, silver, platinum, gold, nickel, tin, titanium, cobalt, zinc, lead, aluminum, tungsten, tantalum, hafnium, chromium, or the like. A planarization step such as CMP, or the like, may be performed to level top surfaces of the conductive material and seed layer with top surfaces of the insulating material 294 and a top surface of the die 100.

The remaining conductive material and the seed layer in the first openings 293 form TDV gratings 296 and the remaining conductive material and the seed layer in the second opening 295 form TDV walls 297. In an embodiment, each of the TDV walls 297 may have a first width W1 that is in a range from 10 µm to 100 µm. In an embodiment, each of the TDV gratings 296 may have a second width W2 that may is in a range from 10 µm to 100 µm. Each TDV wall 297 and its adjacent corresponding TDV grating 296 may be referred to as an antenna 40.

A patch antenna is a microstrip antenna comprising a flat rectangular sheet or "patch' of metal, usually mounted over a larger sheet of metal called a ground plane. In the embodiment described herein, each of the TDV walls 297 function as a "patch antenna" and the adjacent TDV grating 296 functions as the corresponding ground plane for the TDV wall 297. The TDV wall 297 and its corresponding TDV grating 296 form the antenna 40. The insulating material 294 fills the space between each TDV wall 297 and its corresponding TDV grating 296, forming an antenna cavity structure between the TDV wall 297 and the corresponding TDV grating 296, such as between a first sidewall of the TDV grating 296 and a second sidewall of the corresponding TDV wall 297 that faces the first sidewall. The TDV gratings 296 are electrically grounded when the package 1000 is installed into its intended application environment. For example, in some embodiments, the TDV gratings 296 are electrically connected to conductive connectors 320 (shown subsequently in FIG. 9). The TDV gratings 296 may comprise a conductive mesh, or a set of electrically connected vertical posts or pillars that are parallel to each other. In an embodiment, the TDV gratings 296 may be formed as a solid metal planar structure or any other suitable structure. In an embodiment, the TDV walls 297 may comprise conductive plates. Each of the TDV walls 297 may be electrically connected to the die 100 by a corresponding feed line 271, and each of the TDV gratings 296 may be electrically connected to the die 100 by a corresponding ground line 256. In an embodiment, each TDV grating 296 and its corresponding TDV wall 297 may be electrically coupled to each other.

Advantages can be achieved as a result of the formation of the system on integrated chip (SoIC) package 1000 comprising vertical TDV walls 297 and corresponding vertical TDV gratings 296 to form an antenna oscillation cavity in between each vertical TDV walls 297 and its corresponding vertical TDV grating 296. The TDV walls 297 and TDV gratings 296 can be formed having a varied range of heights and widths. In addition, the spacing between two adjacent vertical TDV walls 297 may be varied, and the spacing between two adjacent vertical TDV gratings 296 may also be varied. These advantages may include one or more embodiments disclosed herein allowing for high-frequency lateral Radio Frequency (RF) transmission suitable for 5G & 6G high-frequency (e.g., 29, 38,77, and 120 GHz) RF transceivers, as well as portable, wearable, IoT (internet of things) and smart phone products. In addition, the thin plated TDV walls 297 and TDV gratings 296 can act as embedded SoIC high-frequency RF emission and receiving antenna structures. Further, the insulating material 294 that surrounds the die 100 has a dielectric constant that is in a range from 3.9 to 4.2, which can help reduce the coupling effect caused by inductors, capacitors and balun in the die 100. Additionally, since the formation process of the TDV walls 297 and the TDV gratings 296 is compatible with current processes, manufacturing costs are reduced and efficiency is increased.

Figure 7:
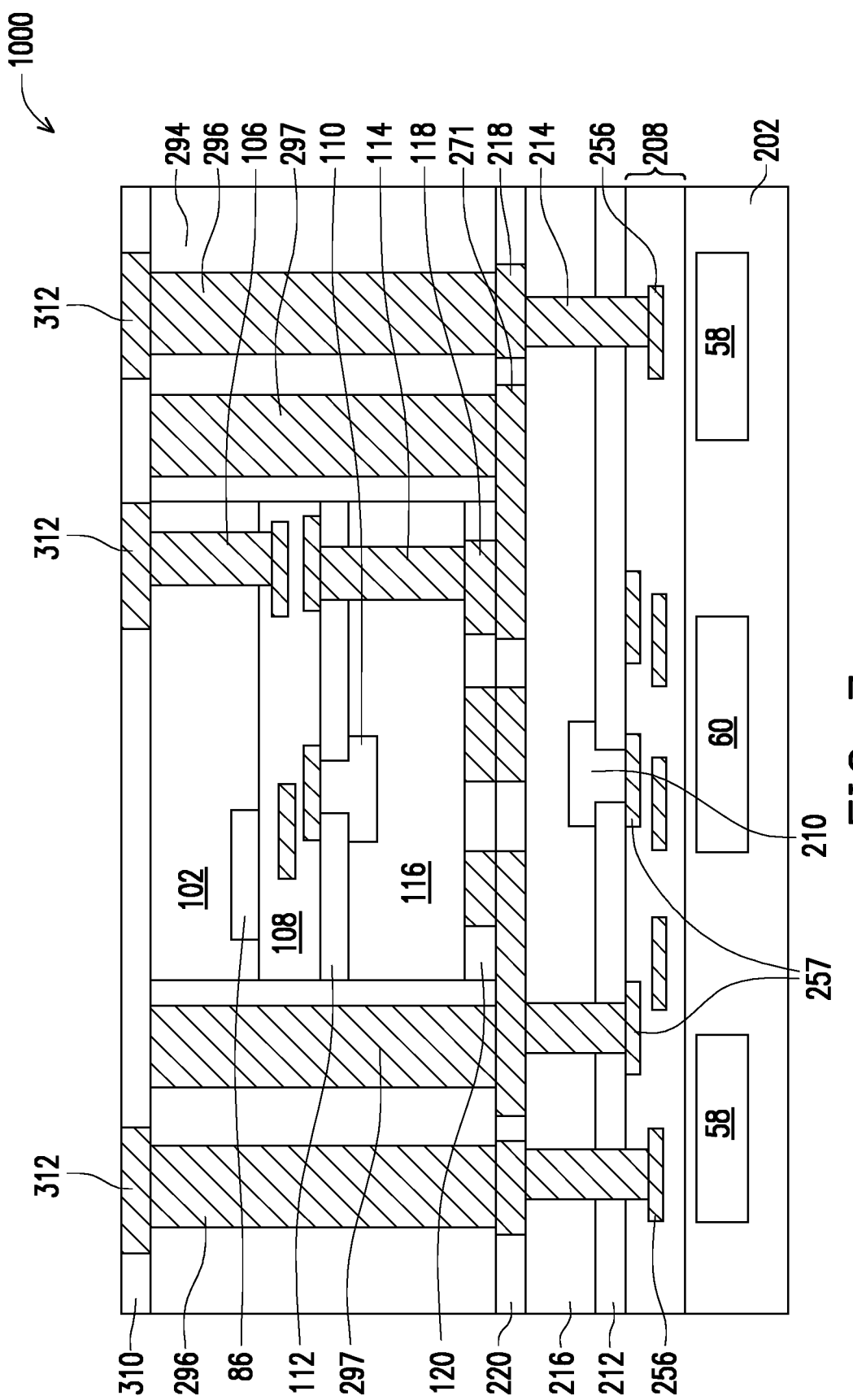

In FIG. 7, a dielectric layer 310 is deposited over the structure shown in FIG. 6 above. The dielectric layer 310 may comprise an oxide (e.g., silicon oxide), a nitride (e.g., silicon nitride), another dielectric material, or the like, formed by CVD, ALD, PVD, or the like. The dielectric layer 310 is then patterned using acceptable photolithography and etching techniques (e.g., wet etching or dry etching) to form openings for RDL 312. The openings may expose top surfaces of the TDV gratings 296 and the TSV 106. For example, an etch process may be performed that may comprise a dry etch that includes an inductively coupled plasma (ICP) etch, reactive ion etch (RIE), the like, or a combination thereof. Next, a seed layer (not shown) is deposited into the openings and over the dielectric layer 310. The seed layer may comprise a conductive material, such as copper, titanium, or the like and may be deposited using processes such as sputtering, evaporation, CVD, plasma-enhanced chemical vapor deposition (PECVD), a plating process, an electroless plating process, or the like. A conductive material may then be deposited over the seed layer to fill the openings through a plating process, electroless plating process CVD, PECVD, or the like. The conductive material may be a metal such as copper, or the like. A planarization step such as CMP, or the like, may be performed to level top surfaces of the conductive material with top surfaces of the dielectric layer 310.

In FIG. 8, a dielectric layer 316 is deposited over the dielectric layer 310 and the RDL 312. The dielectric layer 316 may comprise an oxide (e.g., silicon oxide), a nitride (e.g., silicon nitride), another dielectric material, or the like, formed by PECVD, CVD, ALD, or the like. In an embodiment, the dielectric layer 316 may comprise silicon nitride having a thickness T1 that may be in a range from 1000 Å to 20000 Å. Next, a polymer layer 318 is formed over the dielectric layer 316. In an embodiment, the polymer layer 318 may comprise a polymide, polybenzoxazole (PBO), a polymide derivative, or the like. The polymer layer 318 may be formed using a spin-coating process, or the like, and may have a thickness T2 that is in a range from 1 µm to 20 µm.

In FIG. 9, openings for the conductive connectors 320 are formed through dielectric layer 316 and the polymer layer 318. The openings may be formed using acceptable photolithography and etching techniques. Next, conductive connectors 320 are formed to fill the openings. The conductive connectors 320 may comprise micro bumps, electroless nickel-electroless palladium-immersion gold technique (ENEPIG) formed bumps, or the like. To form the conductive connectors 320, a conductive material 322 may be formed in the openings using a deposition process such as sputtering, evaporation, CVD, plasma-enhanced chemical vapor deposition (PECVD), a plating process, an electroless plating process, or the like. The conductive material 322 may comprise aluminum, copper, silver, gold, nickel, tungsten, alloys thereof, and/or multi-layers thereof. Next, a mask is formed on the polymer layer 318 and the conductive material 322 and patterned to form an opening that overlaps the conductive material 322. Subsequently, conductive material 324 is formed into the opening and over the conductive material 322 using a plating process, an electroless plating process, or the like. The mask is then removed. The conductive material 324 may comprise pure copper or copper alloys.

Still referring to FIG. 9, a conductive material 326 may be formed on the conductive material 324. The conductive material 326 may comprise nickel and may be formed by electroless nickel electroless palladium immersion gold (ENEPIG), which includes a nickel layer, a palladium layer on the nickel layer, and a gold layer on the palladium layer. In an alternate embodiment, the conductive material 326 may be formed by a plating process. In some embodiments, some of the conductive connectors 320 may be electrically connected to the bottom die 200 through the die 100, and some of the conductive connectors 320 may be electrically connected to the bottom die 200 through the antenna 40 (e.g., the TDV grating 296 or the TDV wall 297).

FIG. 10 shows a top-down view of the package 1000. The package 1000 may comprise a single die 100 having one or more antennas 40 adjacent to each sidewall of the die 100. In an embodiment, the number of antennas 40 adjacent to each sidewall of the die 100 is equal to each other. In an embodiment, the number of antennas 40 adjacent to each sidewall of the die 100 is different from each other. In an embodiment, the number of antennas 40 adjacent to at least one sidewall of the die 100 may be different to the number of antennas 40 adjacent to at least one other sidewall of the die 100. The TDV wall 297 (e.g., the patch antenna) of each antenna 40 is electrically connected to the die 100 by an antenna feed line 271, which is disposed between the dies 100 and 200. An antenna oscillation cavity is formed between each TDV wall 297 and TDV grating 296 of an antenna 40. The TDV grating 296 functions as a ground plane for the antenna 40. In an embodiment, a distance D1 between a sidewall of the die 100 and a sidewall of a TDV wall 297 that faces the sidewall of the die 100 may be in a range from 10 µm to 9990 µm. In an embodiment, a distance D2 between a sidewall of a TDV grating 296 and a sidewall of a corresponding TDV wall 297 that faces the sidewall of the TDV grating 296 may be in a range from 10 µm to 9990 µm. In an embodiment, a distance D3 between a first sidewall of a TDV grating 296 and a first edge of the insulating material 294 of the package 1000 may be in a range from 10 µm to 9990 µm, and a distance D4 between a second sidewall of the TDV grating 296 and a second edge of the insulating material 294 of the package 1000 may be in a range from 10 μm to 9990 μm, wherein the first edge and the second edge are perpendicular to each other, and the first sidewall of the TDV grating 296 and the second sidewall of the TDV grating 296 are perpendicular to each other. In an embodiment where each of the TDV gratings 296 comprises a set of electrically connected vertical posts or pillars that are parallel to each other, a spacing S1 between two adjacent vertical posts or pillars of the TDV grating 296 may be in a range from 10 μm to 9900 μm.

Each antenna 40 of the package 1000 comprises a vertical TDV wall 297 and corresponding vertical TDV grating 296 to form an antenna oscillation cavity in between the vertical TDV wall 297 and its corresponding vertical TDV grating 296. In this way, a major surface of the vertical TDV wall 297 (e.g., the conductive plate) is disposed in a plane that is perpendicular to a major surface of the substrate 202. In addition, a major surface of the TDV grating 296 (e.g., a major surface of each conductive pillar) is disposed in a plane that is perpendicular to a major surface of the substrate 202. The antenna 40 is a directional antenna which allows it to transmit or receive power in specific directions. Because of the vertical orientations of the TDV wall 297 and TDV grating 296 of each antenna 40, each antenna 40 is able to transmit or receive 5G & 6G high-frequency radiation in a lateral direction that is parallel to a major surface of the substrate 202.

Figure 11A:
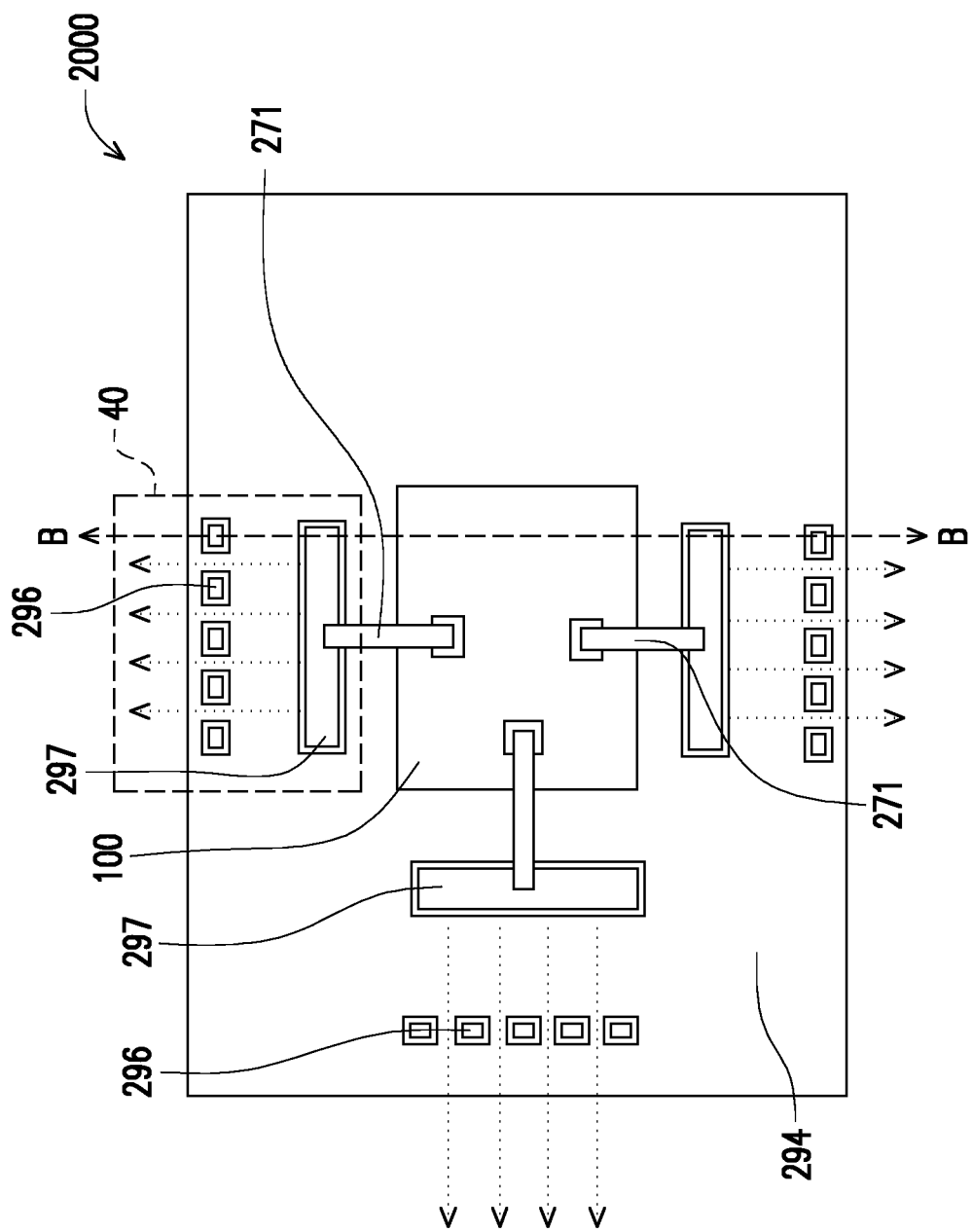
FIGS. 11A and 11B illustrates a top-view and a cross-sectional view of a package 2000 in accordance with an alternate embodiment.
Figure 11B:
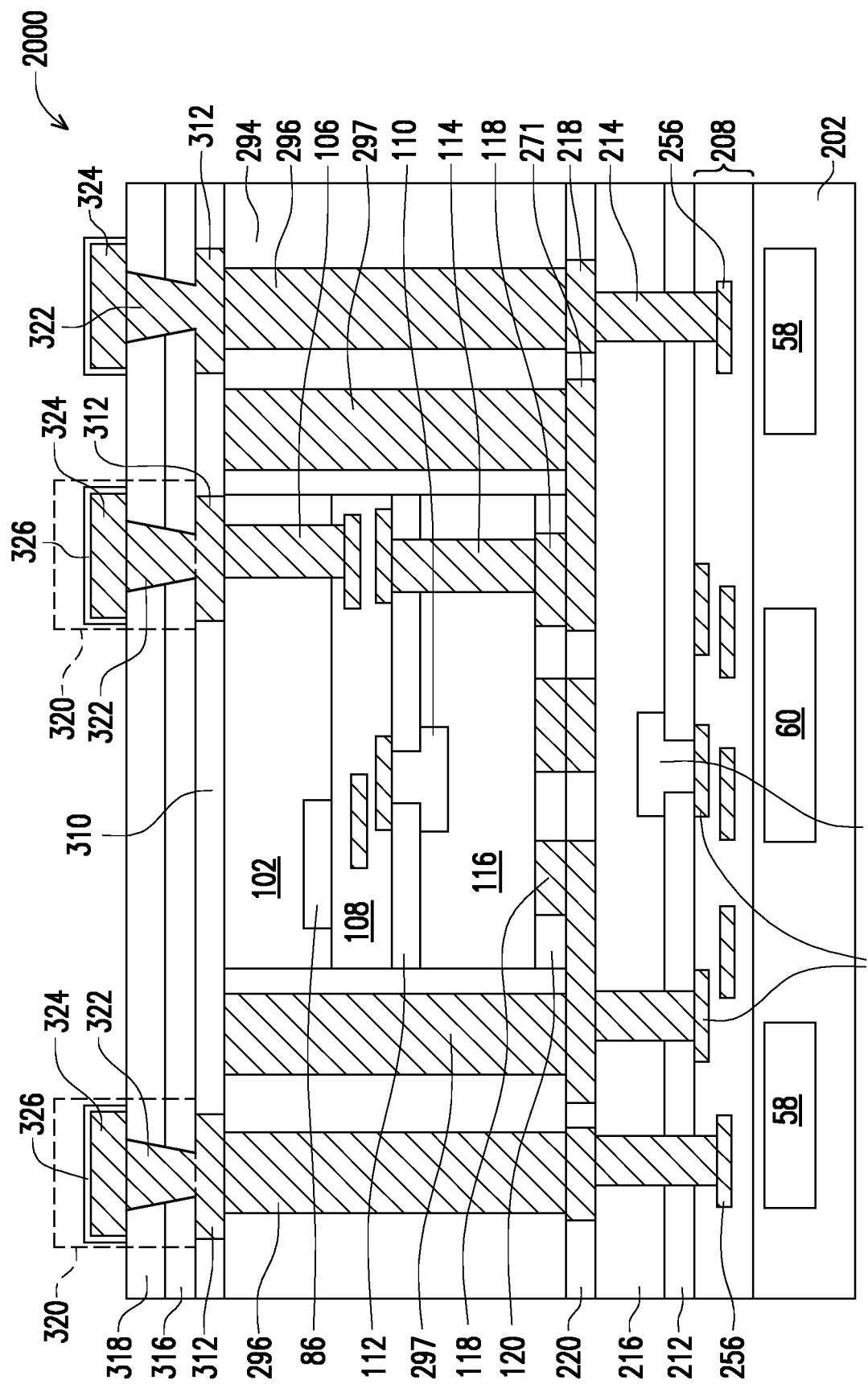

FIG. 11A illustrates a cross-sectional view and FIG. 11B illustrates a top-view of a package 2000, in accordance with alternate embodiments. Unless specified otherwise, like reference numerals in this embodiment (and subsequently discussed embodiments) represent like components in the embodiment shown in FIGS. 1 through 10 formed by like processes. Accordingly, the process steps and applicable materials may not be repeated herein.

In FIG. 11A, the package 2000 is illustrated comprising a single die 100 having one or more antennas 40 adjacent to each of a first, a second, and a third sidewall of the die 100. In an embodiment, a fourth sidewall of the die 100 has no antenna 40 adjacent to it. In an embodiment, the number of antennas 40 adjacent to each of the first, the second, and the third sidewalls of the die 100 is equal to each other. In an embodiment, the number of antennas 40 adjacent to each of the first, the second, and the third sidewalls of the die 100 is different from each other. In an embodiment, the number of antennas 40 adjacent to at least one of the first, the second, and the third sidewalls of the die 100 may be different to the number of antennas 40 adjacent to at least one of the others of the first, the second, and the third sidewalls of the die 100. FIG. 11B shows a cross-sectional view of the package 2000 that references cross-section B-B illustrated in FIG. 11A, in accordance with some exemplary embodiments.

Figure 12A:
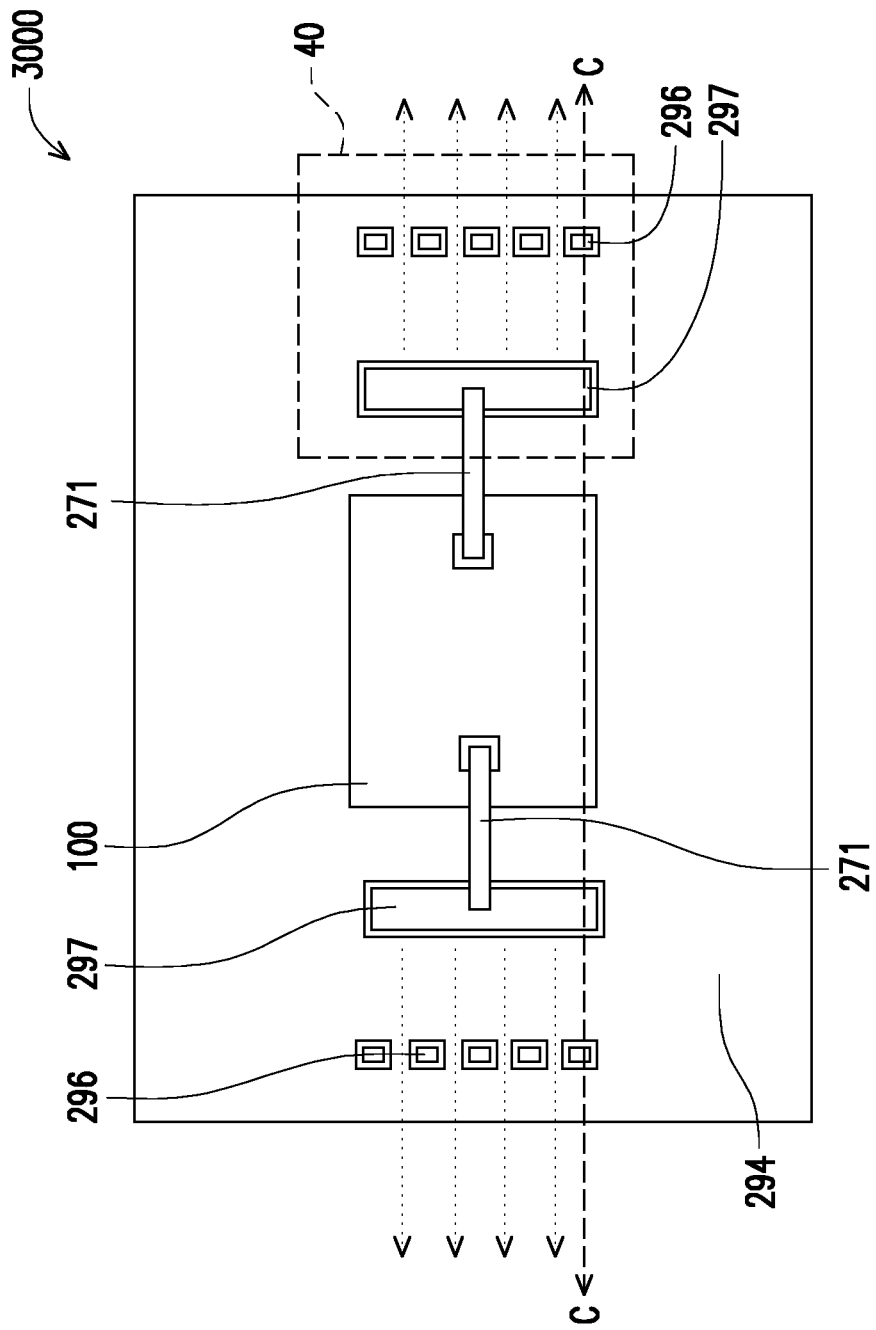
FIGS. 12A and 12B illustrates a top-view and a cross-sectional view of a package 3000 in accordance with an alternate embodiment.
Figure 12B:
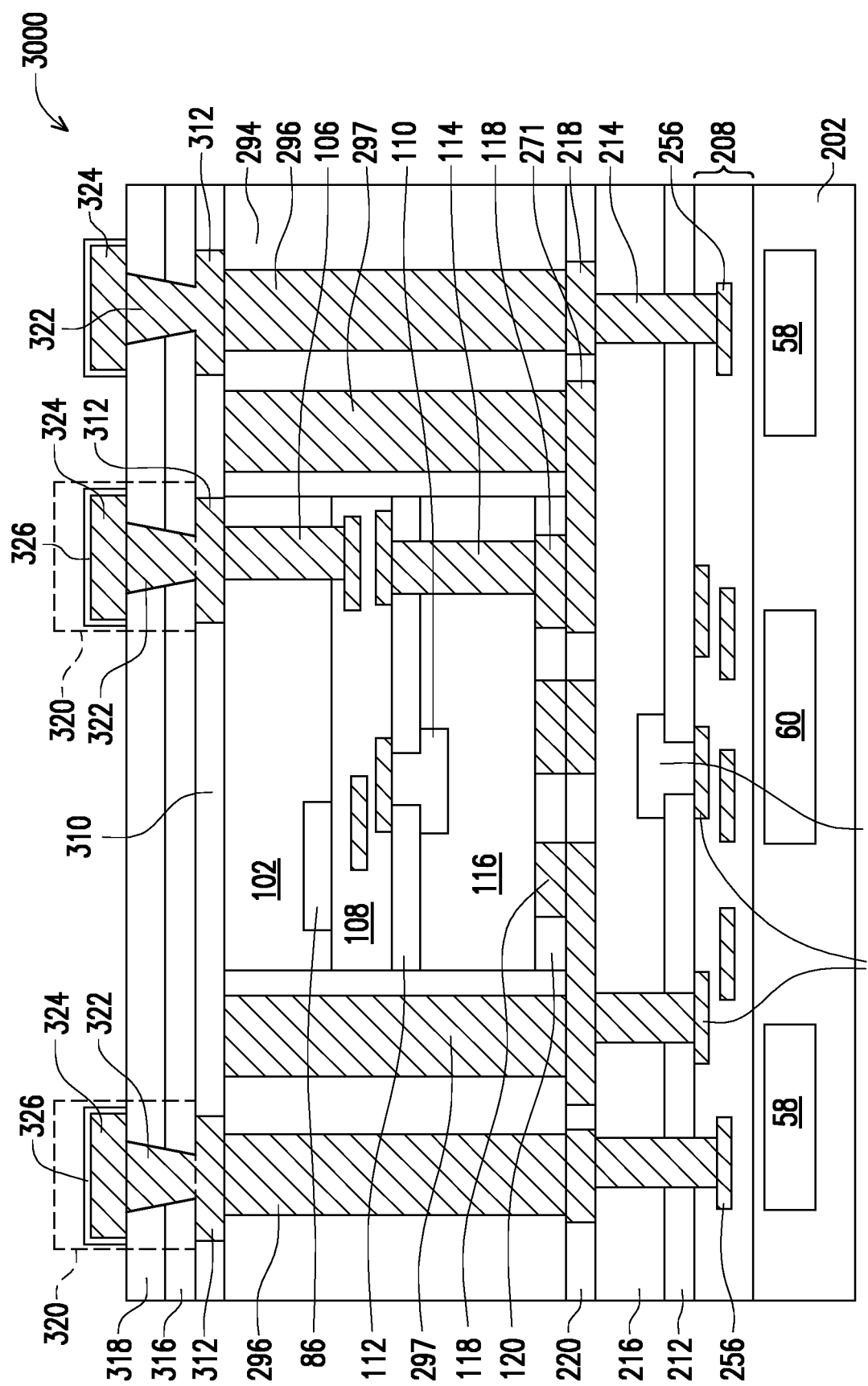

FIG. 12A illustrates a cross-sectional view and FIG. 12B illustrates a top-view of a package 3000, in accordance with alternate embodiments. In FIG. 12A, the package 3000 is illustrated comprising a single die 100 having one or more antennas 40 adjacent to each of a first sidewall and a second sidewall of the die 100. In an embodiment, a third sidewall and a fourth sidewall of the die 100 have no antenna 40 adjacent to them. In an embodiment, the first sidewall and the second sidewall of the die 100 are parallel to each other, and the third sidewall and the fourth sidewall of the die 100 are parallel to each other. In an embodiment, the number of antennas 40 adjacent to the first sidewall of the die 100 is equal to the number of antennas 40 adjacent to the second sidewall of the die 100. In an embodiment, the number of antennas 40 adjacent to the first sidewall of the die 100 is different to the number of antennas 40 adjacent to the second sidewall of the die 100. FIG. 12B shows a cross-sectional view of package 3000 that references cross-section C-C illustrated in FIG. 12A, in accordance with some exemplary embodiments.

Figure 13A:
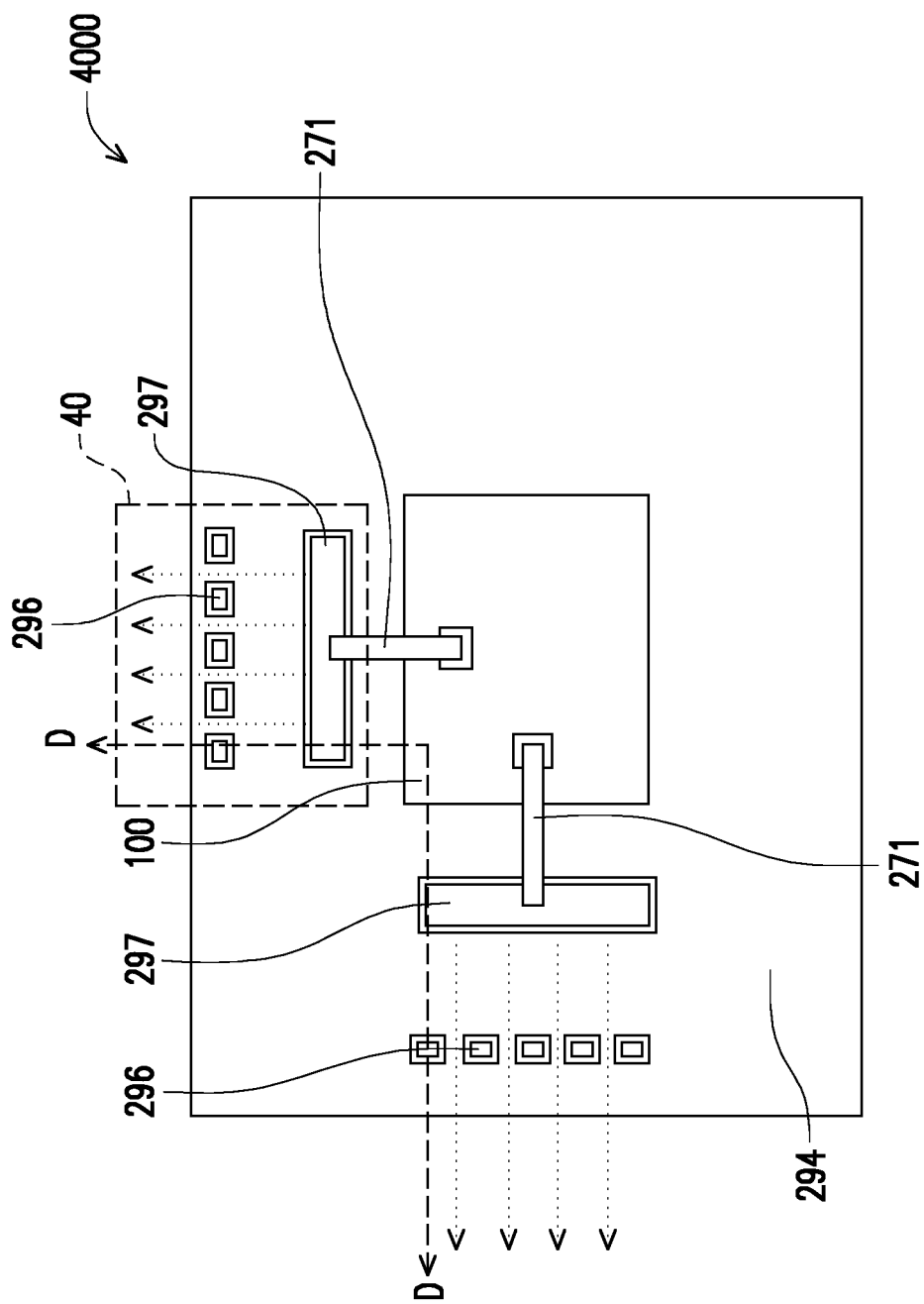
FIGS. 13A and 13B illustrates a top-view and a cross-sectional view of a package 4000 in accordance with an alternate embodiment.
Figure 13B:
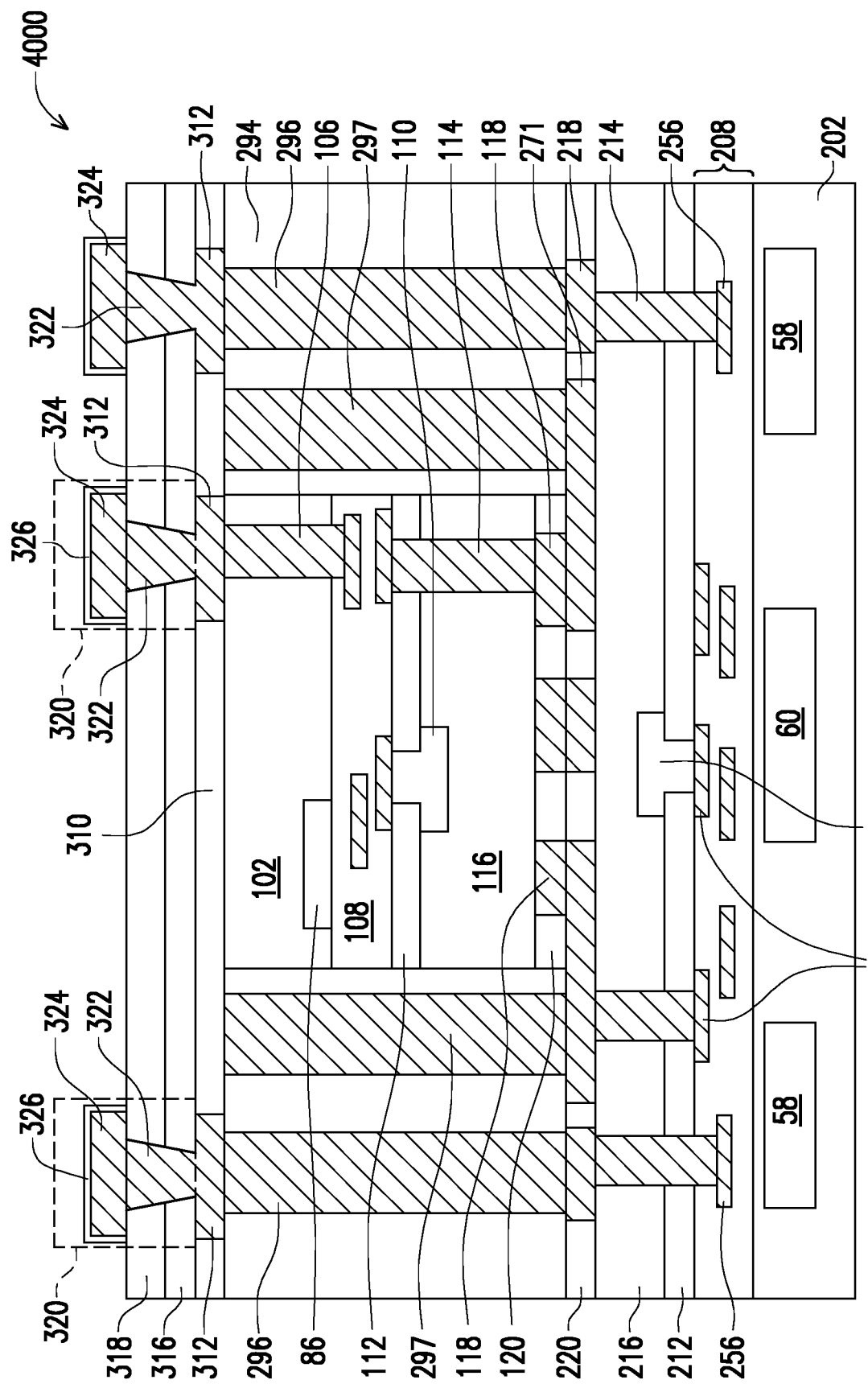

FIG. 13A illustrates a cross-sectional view and FIG. 13B illustrates a top-view of a package 4000, in accordance with alternate embodiments. In FIG. 13A, the package 4000 is illustrated comprising a single die 100 having one or more antennas 40 adjacent to each of a first sidewall and a second sidewall of the die 100. In an embodiment, a third sidewall and a fourth sidewall of the die 100 have no antenna 40 adjacent to them. In an embodiment, the first sidewall and the second sidewall of the die 100 are perpendicular to each other, and the third sidewall and the fourth sidewall of the die 100 are perpendicular to each other. In an embodiment, the number of antennas 40 adjacent to the first sidewall of the die 100 is equal to the number of antennas 40 adjacent to the second sidewall of the die 100. In an embodiment, the number of antennas 40 adjacent to the first sidewall of the die 100 is different to the number of antennas 40 adjacent to the second sidewall of the die 100. FIG. 13B shows a cross-sectional view of the package 4000 that references cross-section D-D illustrated in FIG. 13A, in accordance with some exemplary embodiments.

Figure 14A:
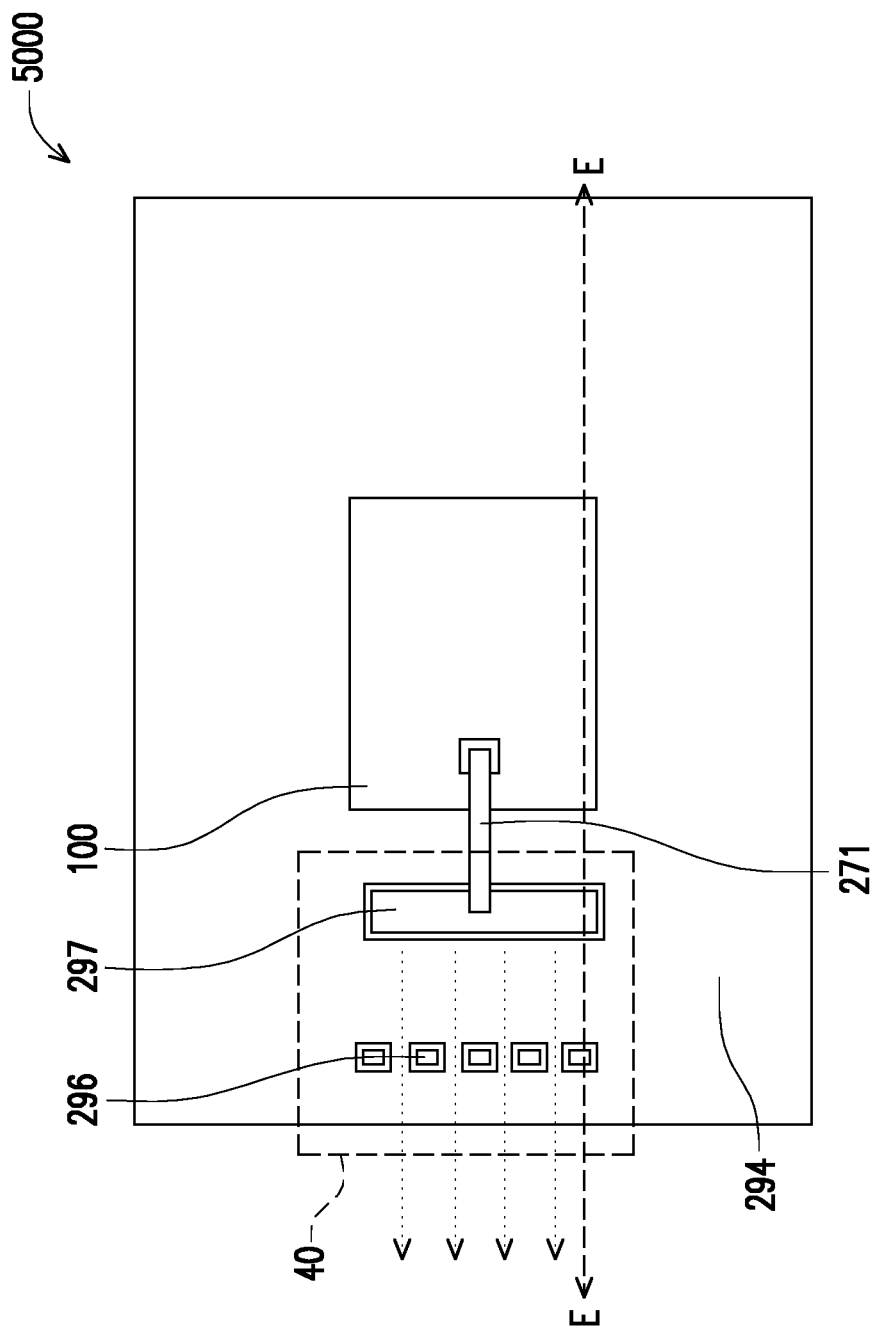
FIGS. 14A and 14B illustrates a top-view and a cross-sectional view of a package 5000 in accordance with an alternate embodiment.
Figure 14B:
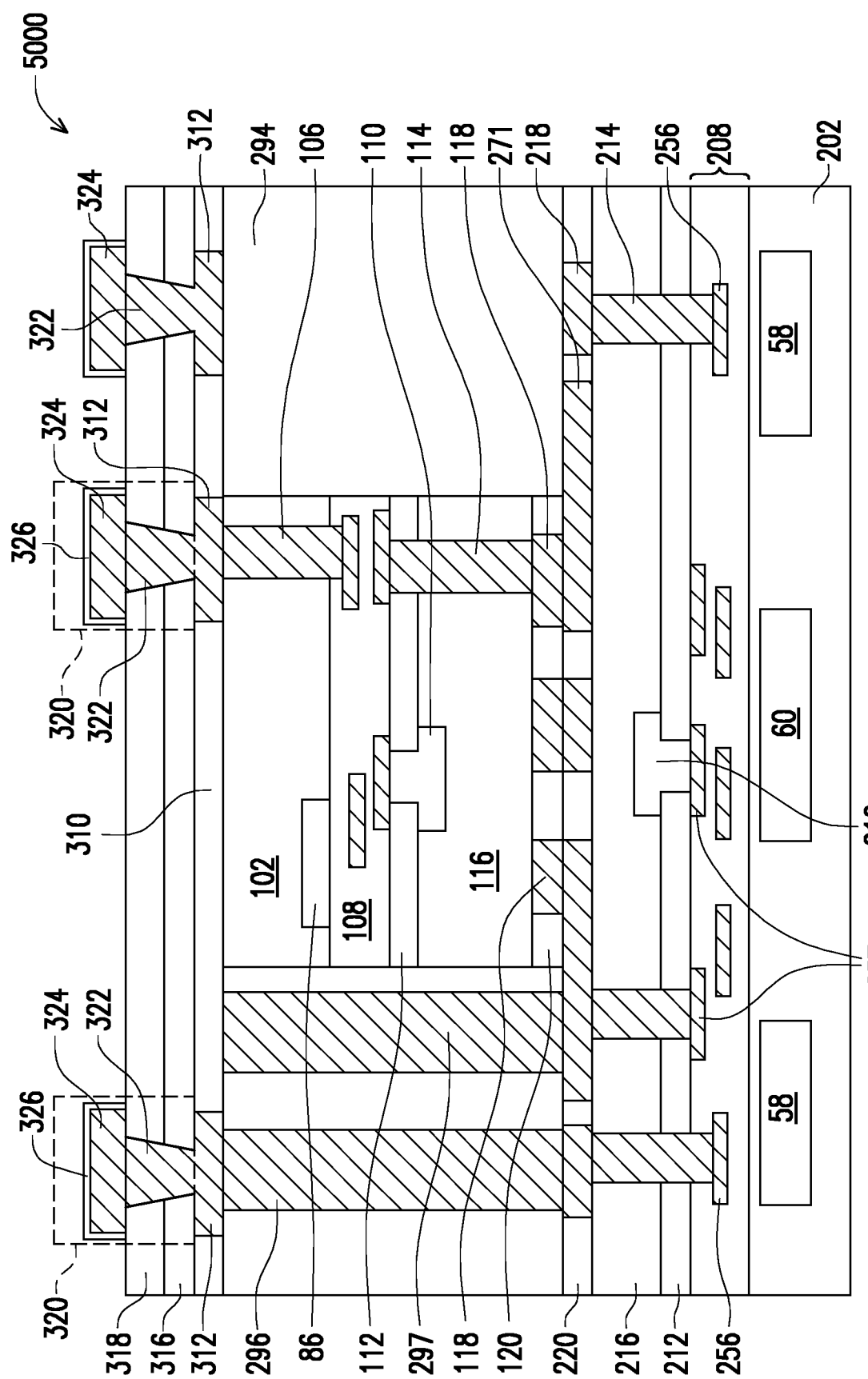

FIG. 14A illustrates a cross-sectional view and FIG. 14B illustrates a top-view of a package 5000, in accordance with alternate embodiments. In FIG. 14A, the package 5000 is illustrated comprising a single die 100 having one or more antennas 40 adjacent to a first sidewall of the die 100. In an embodiment, a second sidewall, a third sidewall and a fourth sidewall of the die 100 have no antennas 40 adjacent to them. FIG. 14B shows a cross-sectional view of the package 4000 that references cross-section E-E illustrated in FIG. 14A, in accordance with some exemplary embodiments.

Figure 15A:
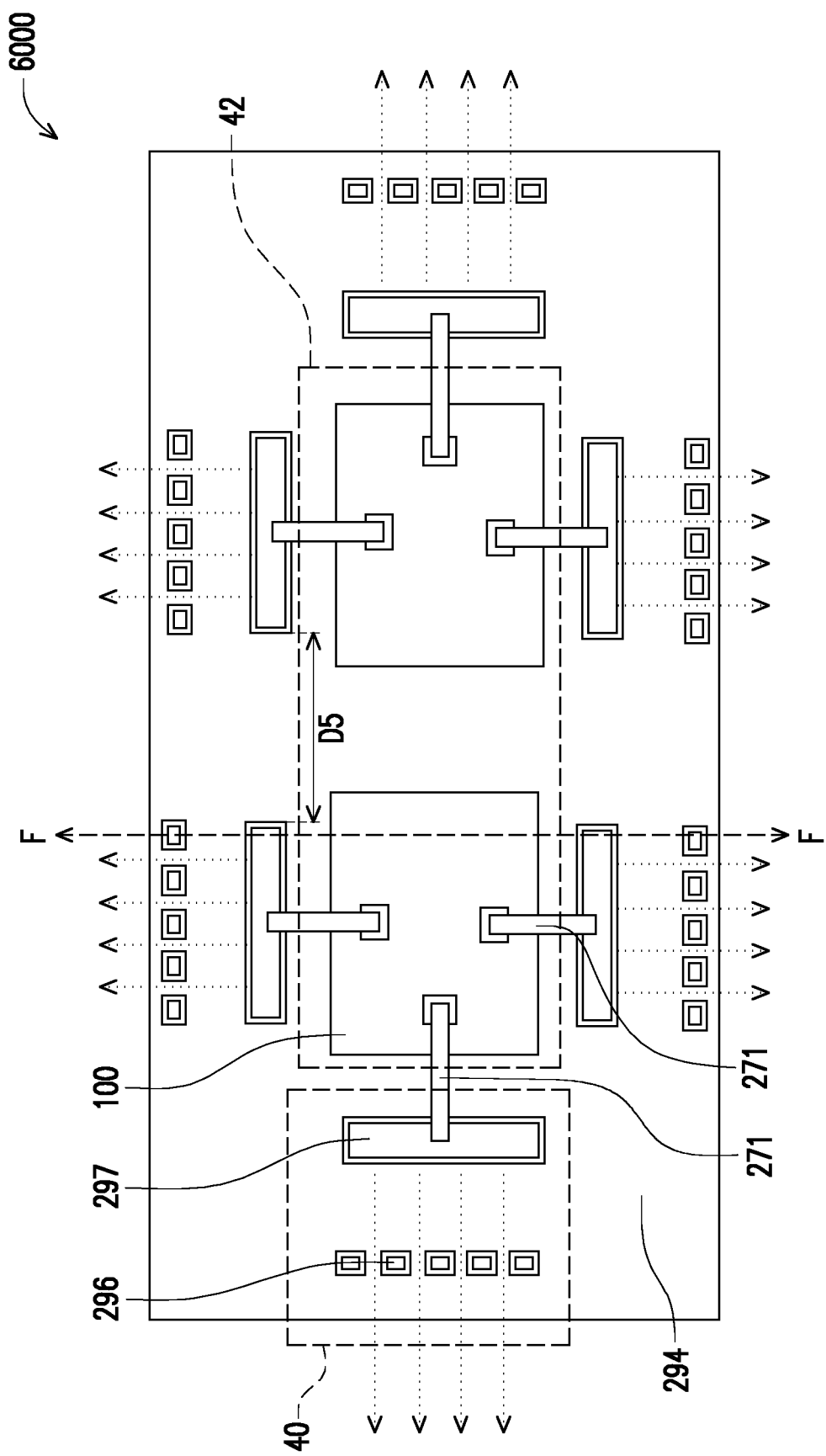
FIGS. 15A and 15B illustrates a top-view and a cross-sectional view of a package 6000 in accordance with an alternate embodiment.
Figure 15B:
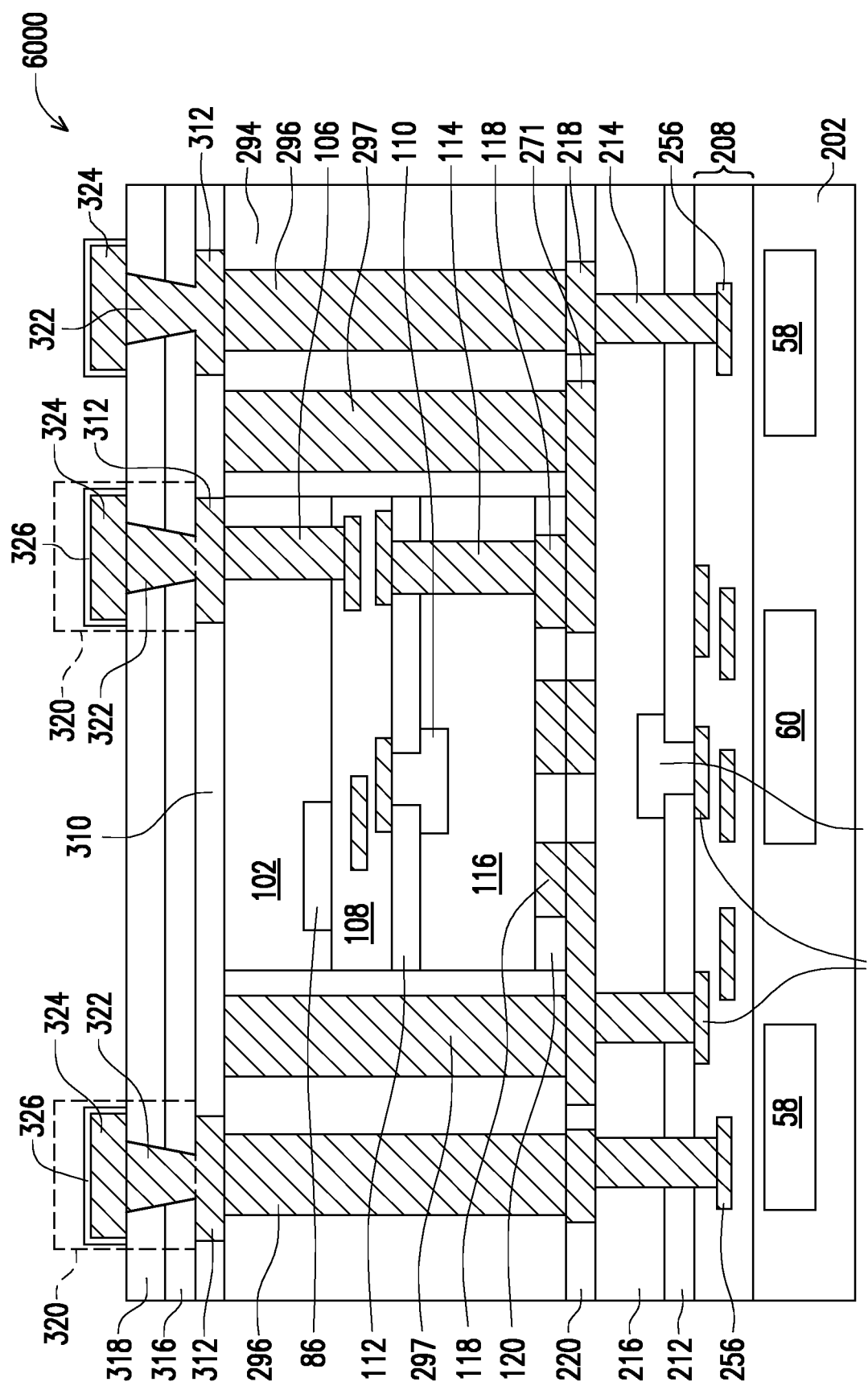

FIG. 15A illustrates a cross-sectional view and FIG. 15B illustrates a top-view of a package 6000, in accordance with alternate embodiments. In FIG. 15A, the package 6000 is illustrated comprising a die region 42 that may include two or more dies 100 that are adjacent to each other. The package 6000 comprises one or more antennas adjacent to each of a first, a second, a third, and a fourth side of the die region 42. The TDV wall 297 (e.g., the patch antenna) of each antenna 40 is electrically connected to one of the dies 100 in the die region 42 by an antenna feed line 271. In an embodiment, the number of antennas 40 adjacent to each of the first, the second, the third, and the fourth sides of the die region 42 is the same. In an embodiment, the number of antennas adjacent to each of the first, the second, the third, and the fourth sides of the die region 42 is different. In an embodiment, the number of antennas 40 adjacent to at least one of the first, the second, the third, and the fourth sides of the die region 42 may be different to the number of antennas 40 adjacent to at least one of the others of the first, the second, the third, and the fourth sides of the die region 42. In an embodiment, a first number of antennas 40 that are adjacent to each of the first, and the third sides of the die region 42 is different from a second number of antennas 40 adjacent to each of the second and the fourth sides of the die region 42. In an embodiment, a distance D5 between a first sidewall of a first TDV wall 297 and a second sidewall of a second TDV wall 297 may be in a range from 10 μm to 99000 μm, wherein the first sidewall faces the second sidewall, wherein a first antenna 40 comprises the first TDV wall 297 and a second antenna 40 comprises the second TDV wall 297, wherein the first antenna 40 and the second antenna 40 are adjacent to each other. FIG. 15B shows a cross-sectional view of the package 6000 that references cross-section F-F illustrated in FIG. 15A, in accordance with some exemplary embodiments.

Figure 16A:
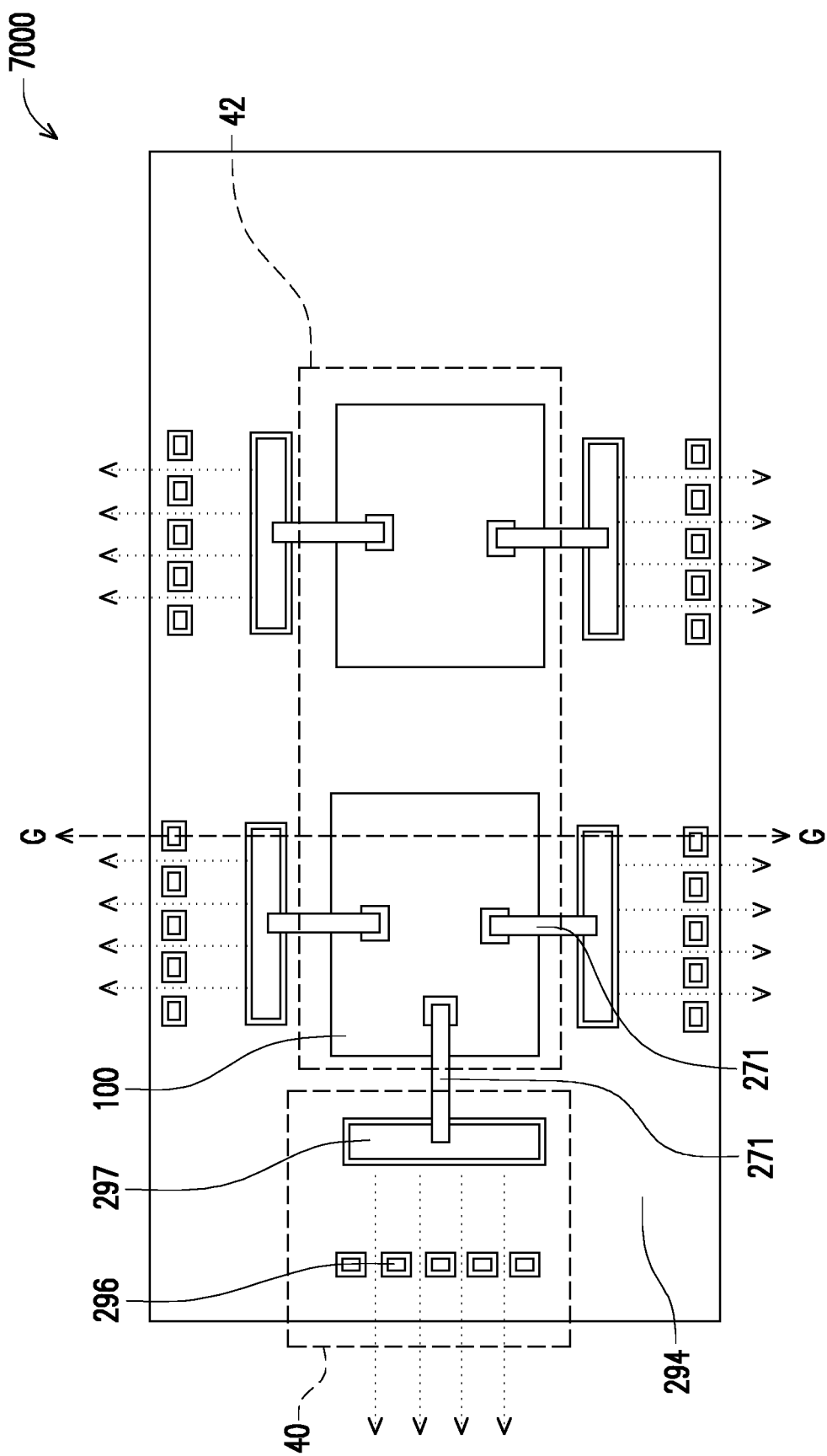
FIGS. 16A and 16B illustrates a top-view and a cross-sectional view of a package 7000 in accordance with an alternate embodiment.
Figure 16B:
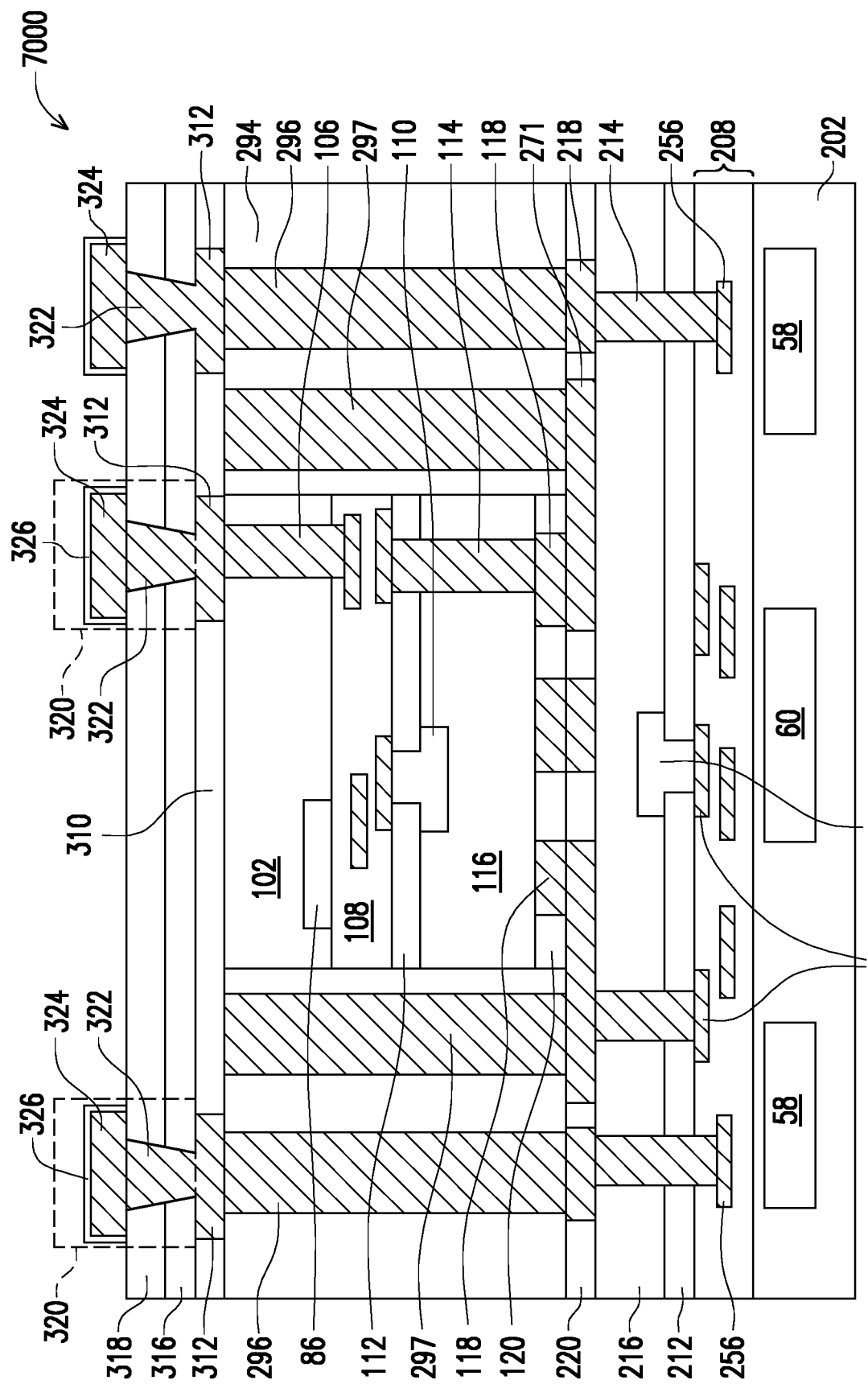

FIG. 16A illustrates a cross-sectional view and FIG. 16B illustrates a top-view of a package 7000, in accordance with alternate embodiments. In FIG. 16A, the package 7000 is illustrated comprising a die region 42 that may include two or more dies 100 that are adjacent to each other. The package 7000 comprises one or more antennas 40 adjacent to each of a first, a second, and a third side of the die region 42. In an embodiment, a fourth side of the die region 42 is not adjacent to an antenna 40. The TDV wall 297 (e.g., the patch antenna) of each antenna 40 is electrically connected to one of the dies 100 in the die region 42 by an antenna feed line 271. In an embodiment, the number of antennas 40 adjacent to each of the first, the second, and the third sides of the die region 42 is the same. In an embodiment, the number of antennas 40 adjacent to each of the first, the second, and the third sides of the die region 42 is different. In an embodiment, the number of antennas 40 adjacent to at least one of the first, the second, and the third sides of the die region 42 may be different to the number of antennas 40 adjacent to at least one of the others of the first, the second, and the third sides of the die region 42. In an embodiment, a first number of antennas 40 that are adjacent to each of the first, and the third sides of the die region 42 is different from a second number of antennas 40 adjacent to the second side of the die region 42, wherein the second side is perpendicular to the first side and the third side. FIG. 16B shows a cross-sectional view of the package 7000 that references cross-section G-G illustrated in FIG. 16A, in accordance with some exemplary embodiments.

Figure 17B:
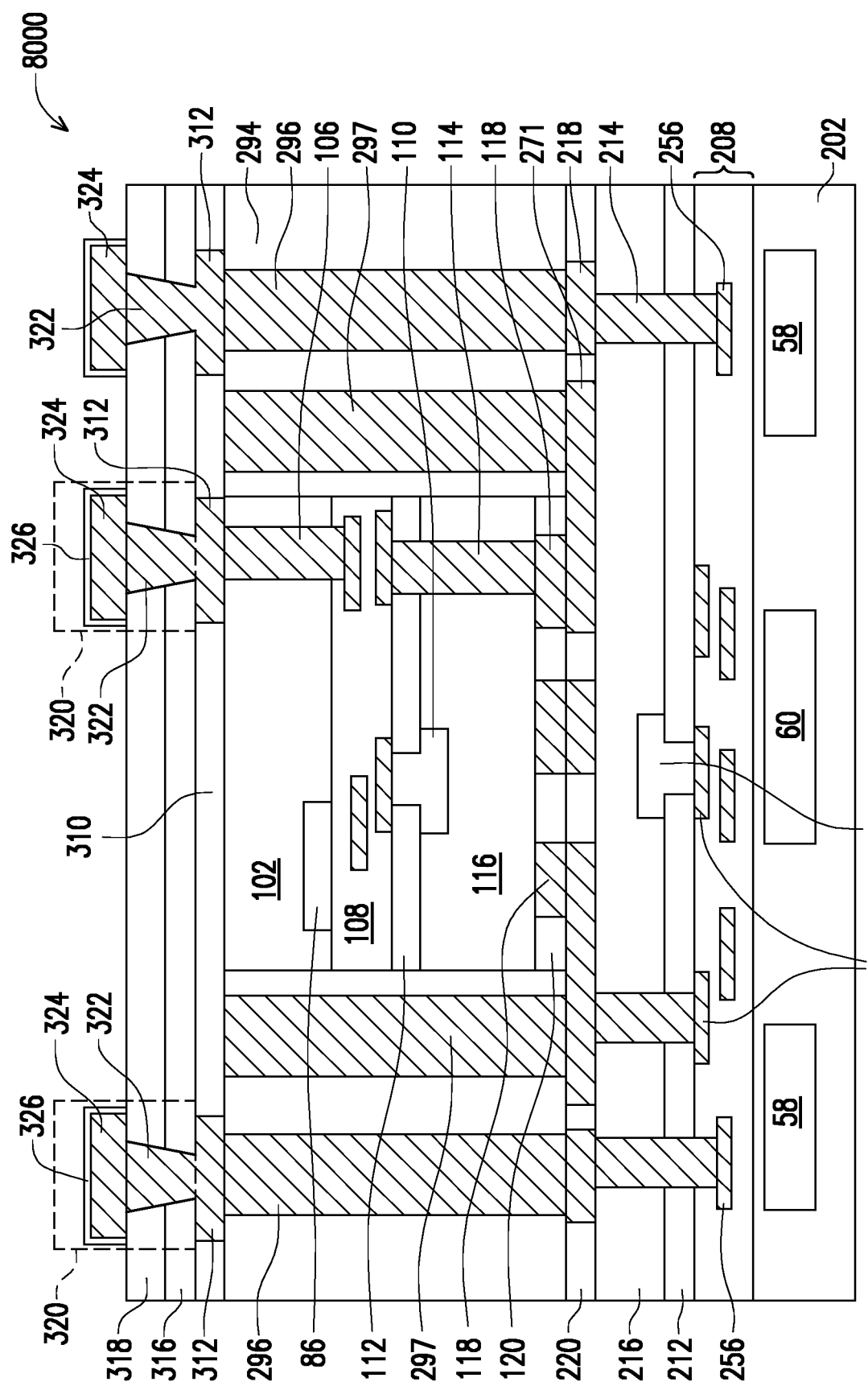

FIG. 17A illustrates a cross-sectional view and FIG. 17B illustrates a top-view of a package 8000, in accordance with alternate embodiments. In FIG. 17A, the package 8000 is illustrated comprising a die region 42 that may include two or more dies 100 that are adjacent to each other. The package 8000 comprises one or more antennas 40 adjacent to each of a first and a third side of the die region 42. In an embodiment, a second and a fourth side of the die region 42 is not adjacent to an antenna 40. The TDV wall 297 (e.g., the patch antenna) of each antenna 40 is electrically connected to one of the dies 100 in the die region 42 by an antenna feed line 271. In an embodiment, the number of antennas 40 adjacent to each of the first and the third sides of the die region 42 is the same. In an embodiment, the number of antennas 40 adjacent to each of the first and the third sides of the die region 42 is different. In an embodiment, the first side and the third side of the die region 42 are perpendicular to the second side and the fourth side of the die region 42. FIG. 17B shows a cross-sectional view of the package 8000 that references cross-section H-H illustrated in FIG. 17A, in accordance with some exemplary embodiments.

Figure 18A:
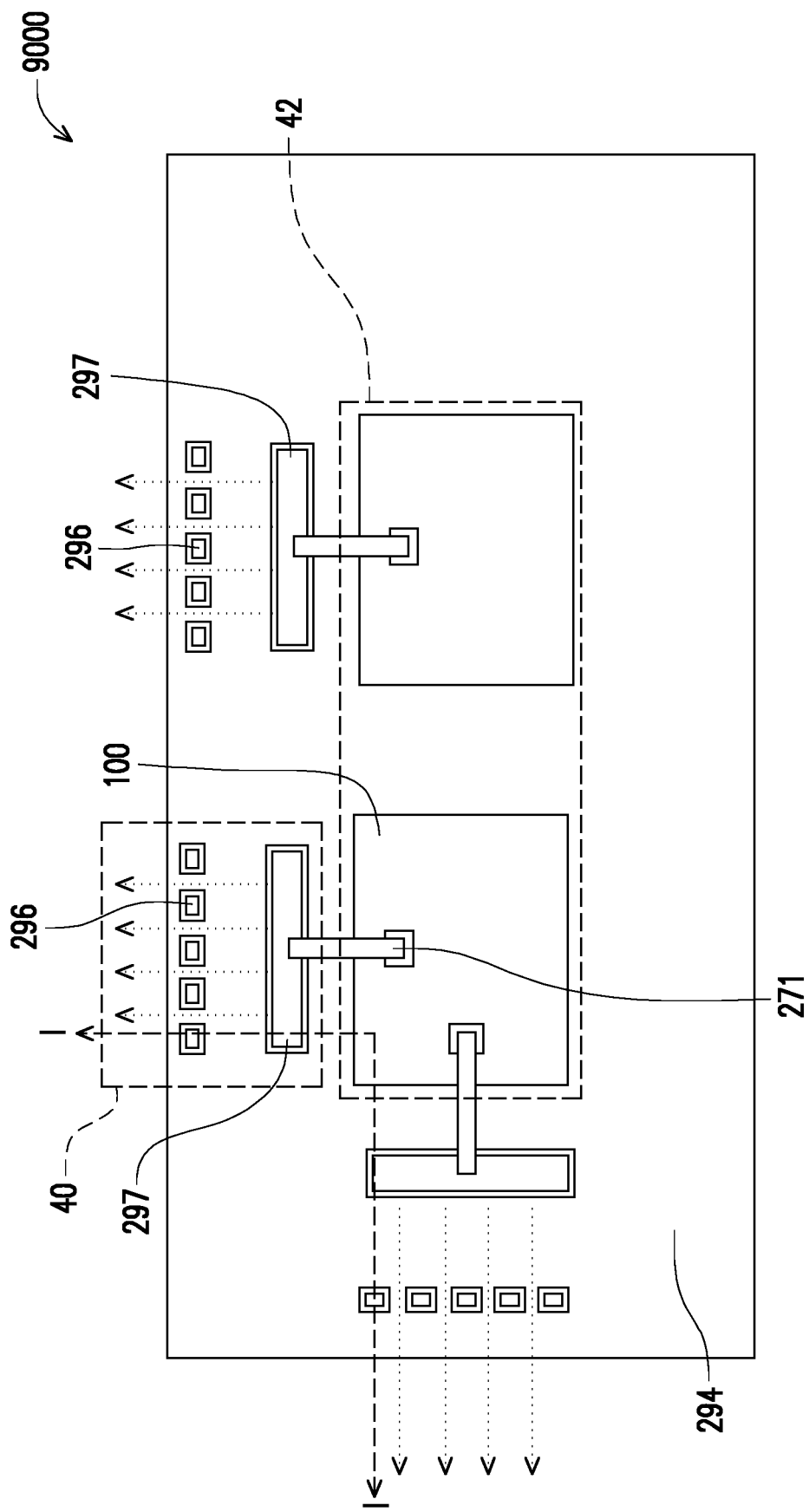
FIGS. 18A and 18B illustrates a top-view and a cross-sectional view of a package 9000 in accordance with an alternate embodiment.
Figure 18B:
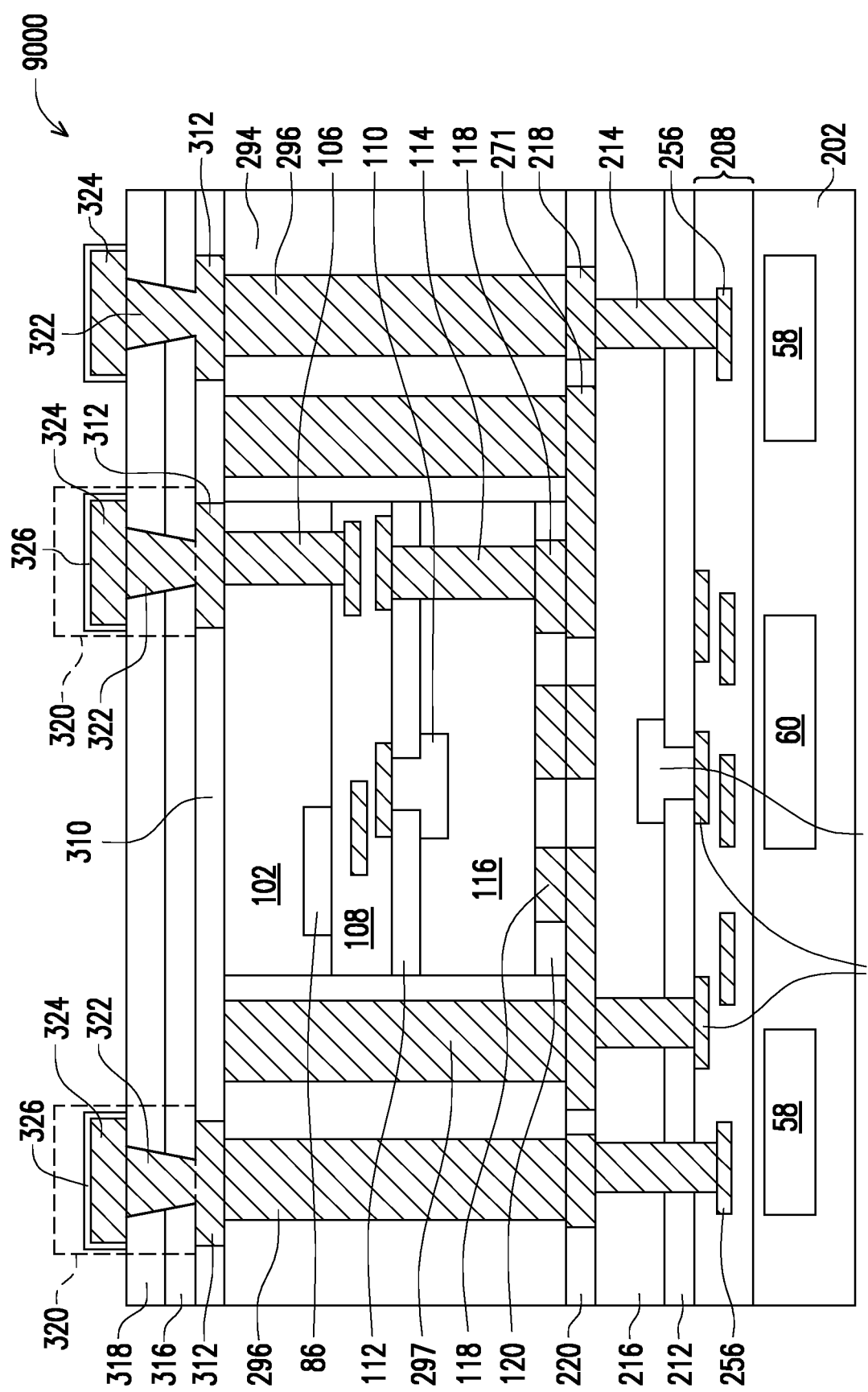

FIG. 18A illustrates a cross-sectional view and FIG. 18B illustrates a top-view of intermediate steps in the forming of a package 9000, in accordance with alternate embodiments. In FIG. 18A, the package 9000 is illustrated comprising a die region 42 that may include two or more dies 100 that are adjacent to each other. The package 9000 comprises one or more antennas 40 adjacent to each of a first and a second side of the die region 42. In an embodiment, a third and a fourth side of the die region 42 is not adjacent to an antenna 40. The TDV wall 297 (e.g., the patch antenna) of each antenna 40 is electrically connected to one of the dies 100 in the die region 42 by an antenna feed line 271. In an embodiment, the number of antennas 40 adjacent to each of the first and the second sides of the die region 42 is the same. In an embodiment, the number of antennas 40 adjacent to each of the first and the second sides of the die region 42 is different. In an embodiment, the first side of the die region 42 is perpendicular to the second side of the die region 42. FIG. 18B shows a cross-sectional view of the package 9000 that references cross-section I-I illustrated in FIG. 18A, in accordance with some exemplary embodiments.

Figure 19A:
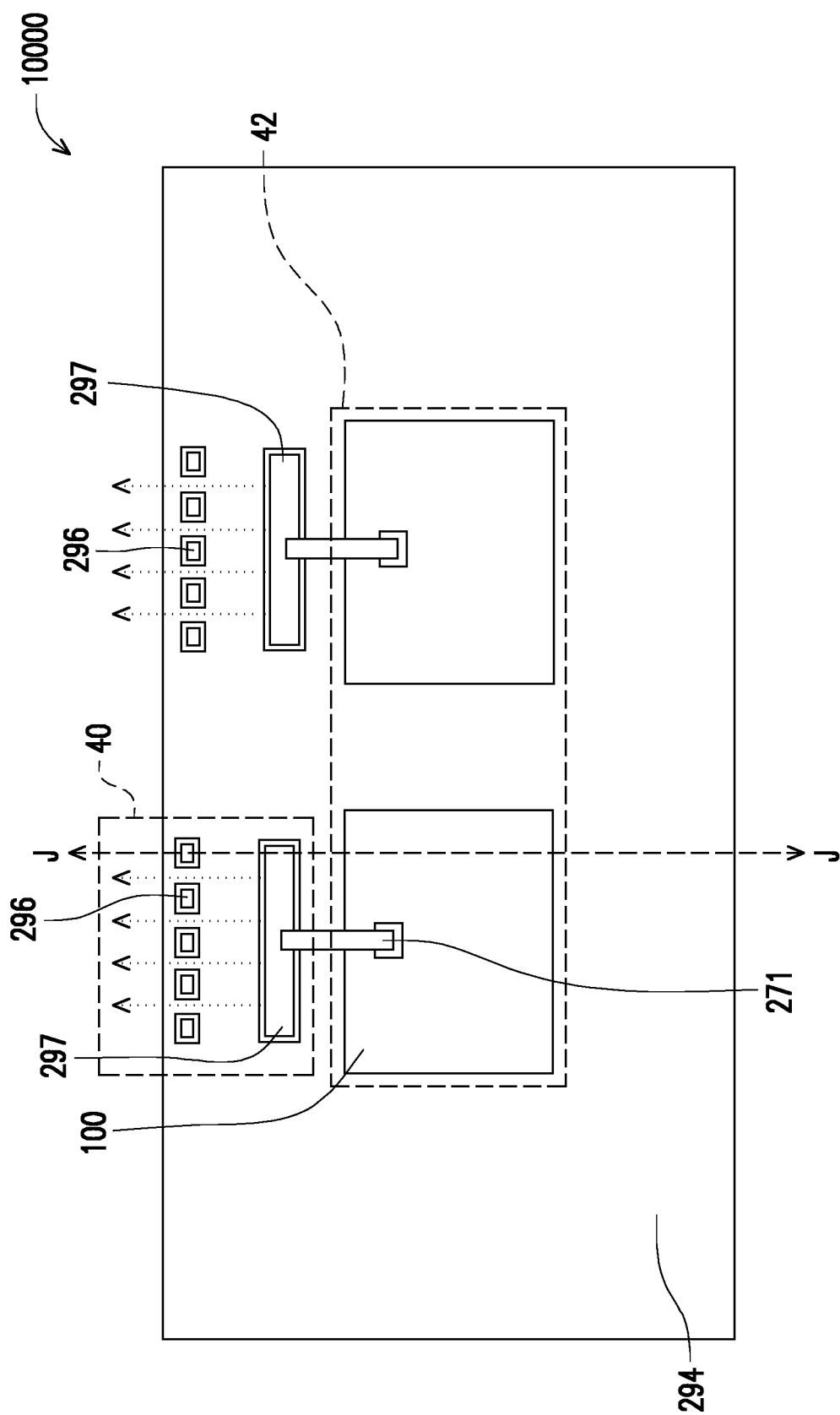
FIGS. 19A and 19B illustrates a top-view and a cross-sectional view of a package 10000 in accordance with an alternate embodiment.
Figure 19B:
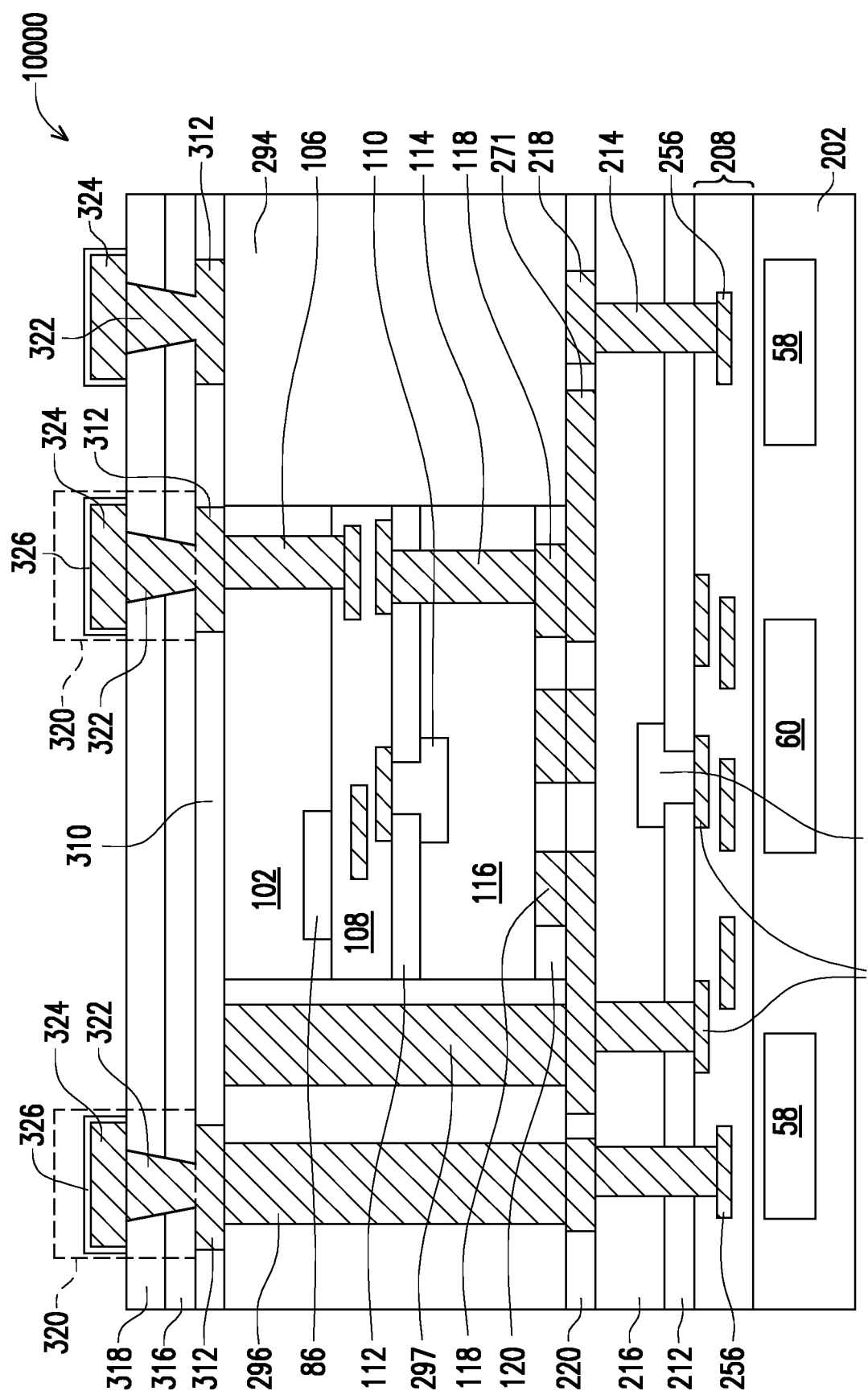

FIG. 19A illustrates a cross-sectional view and FIG. 19B illustrates a top-view of a package 10000, in accordance with alternate embodiments. In FIG. 19A, the package 10000 is illustrated comprising a die region 42 that may include two or more dies 100 that are adjacent to each other. The package 10000 comprises one or more antennas 40 adjacent to a first side of the die region 42. In an embodiment, a second, a third and a fourth side of the die region 42 is not adjacent to an antenna 40. The TDV wall 297 (e.g., the patch antenna) of each antenna 40 is electrically connected to one of the dies 100 in the die region 42 by an antenna feed line 271. FIG. 19B shows a cross-sectional view of the package 10000 that references cross-section J-J illustrated in FIG. 19A, in accordance with some exemplary embodiments.

Figure 20:
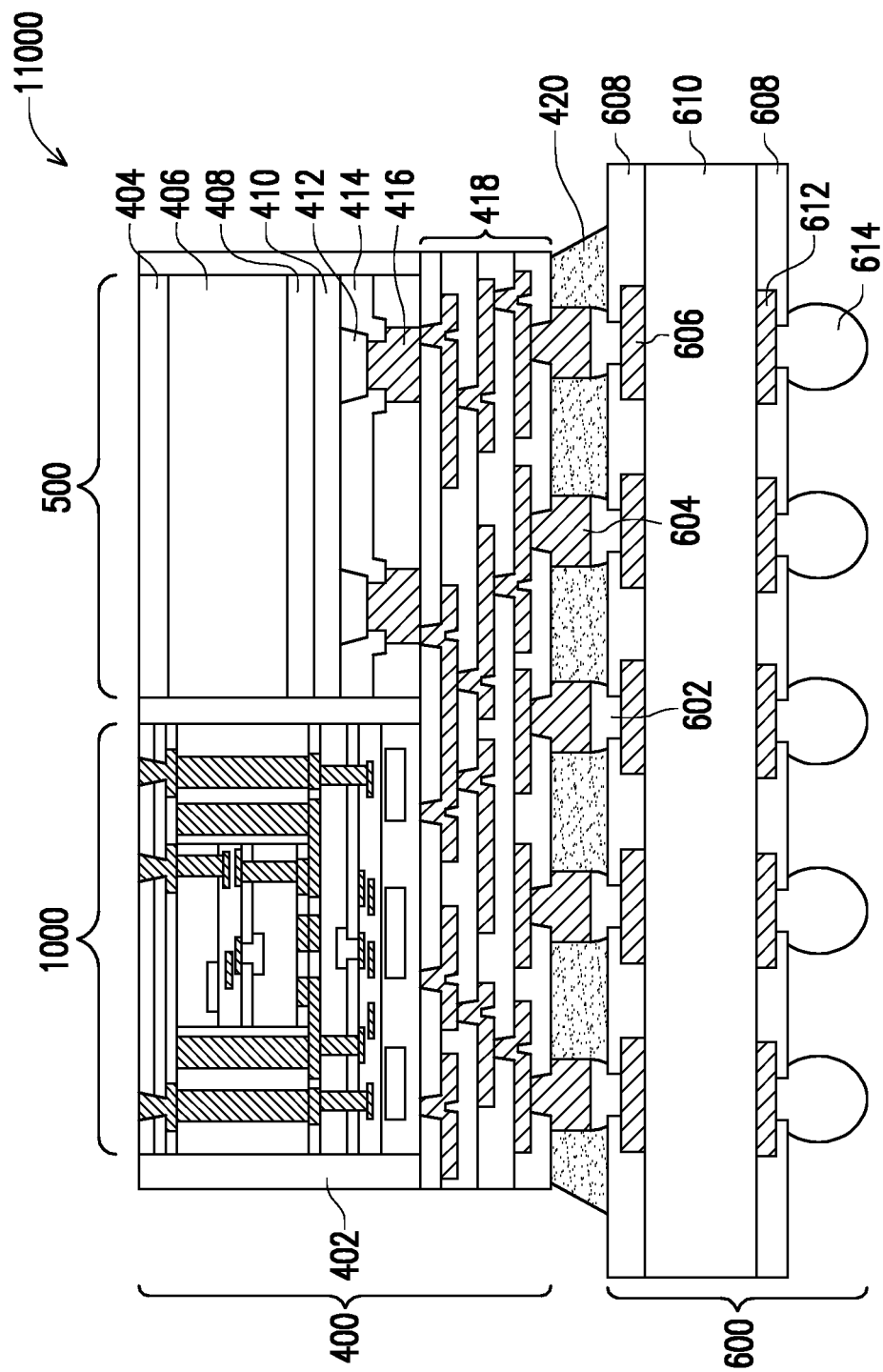
FIG. 20 illustrates a cross-sectional view of a package moo in accordance with an alternate embodiment.

FIG. 20 illustrates a cross-sectional view of a package 11000, in accordance with some embodiments. One or more integrated circuit dies 500 and one or more of any of the packages 1000 through 10000 shown previously in FIGS. 1 through 19B are packaged to form an integrated circuit package. The integrated circuit package may also be referred to as integrated fan-out (InFO) package.

The package 11000 comprises a first package component 400 which includes the integrated circuit die 500. The integrated circuit die 500 may be formed in a wafer, which may include different device regions that are singulated in subsequent steps to form a plurality of integrated circuit dies. The integrated circuit die 500 may be processed according to applicable manufacturing processes to form integrated circuits. For example, the integrated circuit die 500 includes a semiconductor substrate 406, such as silicon, doped or undoped, or an active layer of a semiconductor-on-insulator (SOI) substrate. The semiconductor substrate 406 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 406 has an active surface, sometimes called a front side, and an inactive surface, sometimes called a back side.

Devices may be formed at the front surface of the semiconductor substrate 406. The devices may be active devices (e.g., transistors, diodes, etc.), capacitors, resistors, etc. An inter-layer dielectric (ILD) 408 is over the front surface of the semiconductor substrate 406. The ILD 408 surrounds and may cover the devices. The ILD 408 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

Conductive plugs extend through the ILD 408 to electrically and physically couple the devices. For example, when the devices are transistors, the conductive plugs may couple the gates and source/drain regions of the transistors. The conductive plugs may be formed of tungsten, cobalt, nickel, copper, silver, gold, aluminum, the like, or combinations thereof. An interconnect structure 410 is over the ILD 408 and conductive plugs. The interconnect structure 410 interconnects the devices to form an integrated circuit. The interconnect structure 410 may be formed by, for example, metallization patterns in dielectric layers on the ILD 408. The metallization patterns include metal lines and vias formed in one or more low-k dielectric layers. The metallization patterns of the interconnect structure 410 are electrically coupled to the devices by the conductive plugs.

The integrated circuit die 500 further includes pads 412, such as aluminum pads, to which external connections are made. The pads 412 are on the active side of the integrated circuit die 500, such as in and/or on the interconnect structure 410. One or more passivation films 414 are on the integrated circuit die 500, such as on portions of the interconnect structure 410 and pads 412. Openings extend through the passivation films 414 to the pads 412. Die connectors 416, such as conductive pillars (for example, formed of a metal such as copper), extend through the openings in the passivation films 414 and are physically and electrically coupled to respective ones of the pads 412. The die connectors 416 may be formed by, for example, plating, or the like. The die connectors 416 electrically couple the respective integrated circuits of the integrated circuit die 500.

Each integrated circuit die 500 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, a stacked memory die, a high-bandwidth memory (HBM) die etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like.

The one or more integrated circuit dies 500 and the one or more packages 1000 may be encapsulated by an encapsulant 402 (e.g., a molding compound, epoxy, or the like). The packages 400 and dies 500 may be electrically connected to each other through a front-side redistribution structure 418. In an embodiment, the one or more packages 1000 may be replaced by one or more of the packages 2000 through 10000 shown previously in FIGS. 11A through 19B. The front-side redistribution structure 418 includes any number of dielectric layers and any number of metallization patterns. The metallization patterns may also be referred to as redistribution layers or redistribution lines. The UBMs 604 may be formed of the same material as the metallization pattern of the front-side redistribution structure 418. The conductive connectors 602 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 602 may include a conductive material such as solder, copper, aluminum, gold, nickel, silver, palladium, tin, the like, or a combination thereof. An encapsulant 402 is formed on and around the various components.

The package substrate 600 may comprise a printed circuit board (PCB). In an embodiment, the package substrate 600 includes a substrate core 610 and bond pads 606 over the substrate core 610. The substrate core 610 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 610 may be an SOI substrate. Generally, an SOI substrate includes a layer of a semiconductor material such as epitaxial silicon, germanium, silicon germanium, SOI, SGOI, or combinations thereof. The substrate core bio is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for substrate core 610.

The substrate core 610 may include active and passive devices (not shown). A wide variety of devices such as transistors, capacitors, resistors, combinations of these, and the like may be used to generate the structural and functional requirements of the design for the device stack. The devices may be formed using any suitable methods.

The substrate core 610 may also include metallization layers and vias (not shown), with the bond pads 606 being physically and/or electrically coupled to the metallization layers and vias. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material and may be formed through any suitable process (such as deposition, damascene, dual damascene, or the like). In some embodiments, the substrate core 610 is substantially free of active and passive devices.

In some embodiments, the conductive connectors 602 are reflowed to attach the first package component 400 to the bond pads 606. The conductive connectors 602 electrically and/or physically couple the package substrate 600, including metallization layers in the substrate core 610, to the first package component 400. In some embodiments, a solder resist 608 is formed on the substrate core 610. The conductive connectors 602 may be disposed in openings in the solder resist 608 to be electrically and mechanically coupled to the bond pads 606. The solder resist 608 may be used to protect areas of the substrate core 610 from external damage.

The conductive connectors 602 may have an epoxy flux (not shown) formed thereon before they are reflowed with at least some of the epoxy portion of the epoxy flux remaining after the first package component 400 is attached to the package substrate 600. This remaining epoxy portion may act as an underfill to reduce stress and protect the joints resulting from reflowing the conductive connectors 602. In some embodiments, an underfill 420 may be formed between the first package component 400 and the package substrate 600 and surrounding the conductive connectors 602. The underfill 420 may be formed by a capillary flow process after the first package component 400 is attached or may be formed by a suitable deposition method before the first package component 400 is attached.

In an embodiment, the package substrate 600 may comprise bond pads 612 over the substrate core 610. Conductive connectors 614 may be coupled to the bond pads 612 to allow for the electrical coupling of the package substrate 600 to external circuits or devices. The conductive connectors 614 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 614 may include a conductive material such as solder, copper, aluminum, gold, nickel, silver, palladium, tin, the like, or a combination thereof. In some embodiments, the solder resist 608 is formed on the substrate core 610 and the conductive connectors 614 may be disposed in openings in the solder resist 608 to be electrically and mechanically coupled to the bond pads 612. The solder resist 608 may be used to protect areas of the substrate core 610 from external damage.

In some embodiments, passive devices (e.g., surface mount devices (SMDs), not shown) may also be attached to the first package component 400 (e.g., to the UBMs 604) or to the package substrate 600 (e.g., to the bond pads 606). For example, the passive devices may be bonded to a same surface of the first package component 400 or the package substrate 600 as the conductive connectors 602. The passive devices may be attached to the package component prior to mounting the first package component 400 on the package substrate 600, or may be attached to the package substrate 600 prior to or after mounting the first package component 400 on the package substrate 600.

Figure 21:
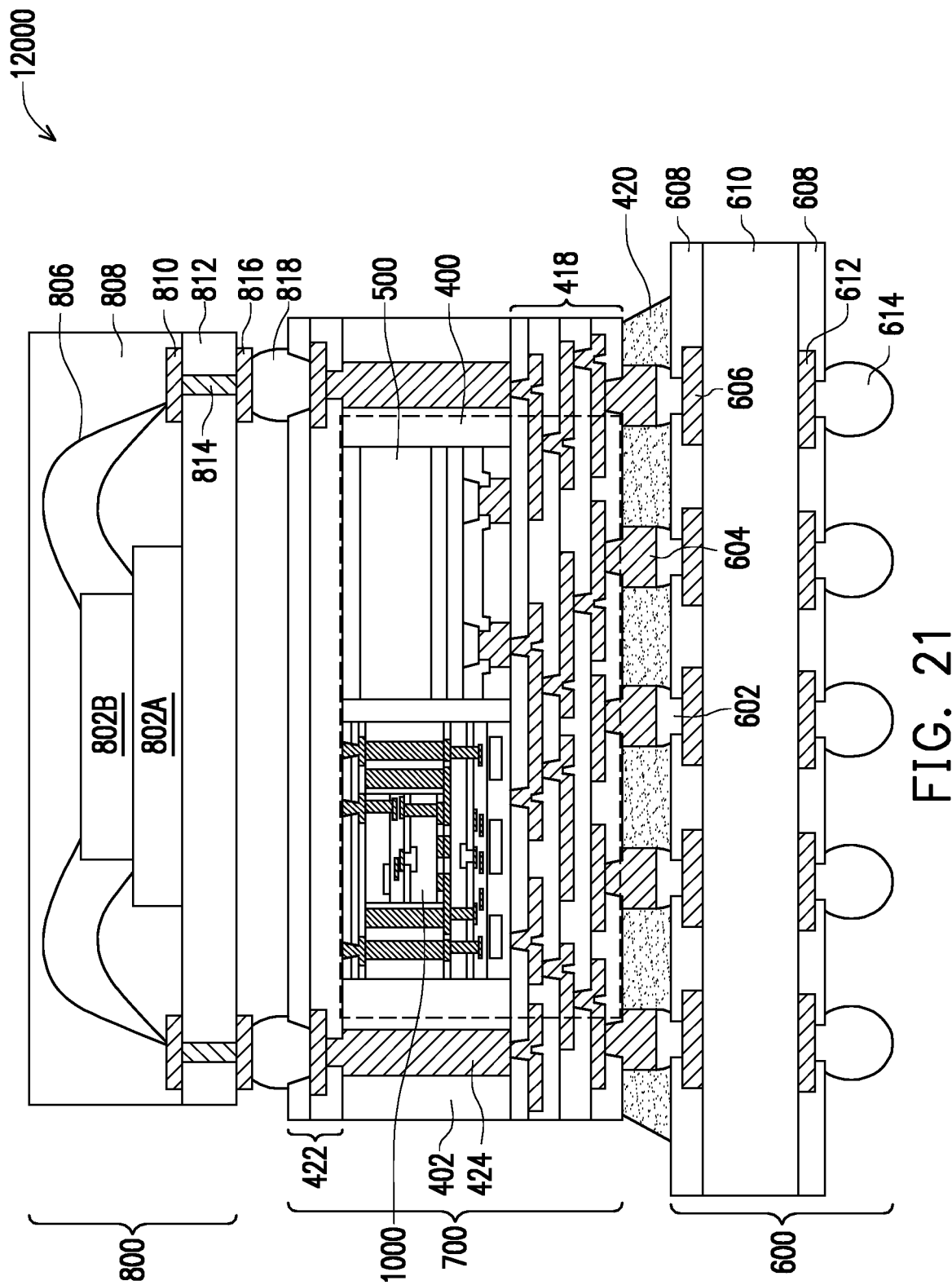
FIG. 21 illustrates a cross-sectional view of a package 12000 in accordance with an alternate embodiment.

FIG. 21 illustrates a cross-sectional view of a package 12000, in accordance with some embodiments. Unless specified otherwise, like reference numerals in this embodiment (and subsequently discussed embodiments) represent like components in the embodiment shown in FIGS. 1 through 20 formed by like processes. Accordingly, the process steps and applicable materials may not be repeated herein. One or more integrated circuit dies 500 and one or more of any of the packages 1000 through 10000 shown previously in FIGS. 1 through 19B are packaged to form an integrated circuit package that comprises device stacks. The device stacks may also be referred to as package-on-package (PoP) structures.

In FIG. 21, a third package component Boo is coupled to a second package component 700. The second package component 700 may be similar to the first package component 400 and unless specified otherwise, like reference numerals in this embodiment represent like components in the embodiment shown in FIG. 20. The second package component 700 may comprise a back-side redistribution structure 422 and through vias 424 extending through the encapsulant 402, which electrically connect the back-side redistribution structure 422 to the front side redistribution structure 418. In the embodiment shown, the back-side redistribution structure 422 may comprise one or more dielectric layers, and at least one metallization pattern (sometimes referred to as redistribution layers or redistribution lines).

The third package component Boo includes, for example, a substrate 812 and one or more stacked dies 802 (e.g., 802A and 802B) coupled to the substrate 812. Although one set of stacked dies 802 (802A and 802B) is illustrated, in other embodiments, a plurality of stacked dies 802 (each having one or more stacked dies) may be disposed side-by-side coupled to a same surface of the substrate 812. The substrate 812 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 812 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 812 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for the substrate 812.

The substrate 812 may include active and passive devices (not shown). A wide variety of devices such as transistors, capacitors, resistors, combinations of these, and the like may be used to generate the structural and functional requirements of the design for the third package component Boo. The devices may be formed using any suitable methods.

The substrate 812 may also include metallization layers (not shown) and the conductive vias 814. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material and may be formed through any suitable process (such as deposition, damascene, dual damascene, or the like). In some embodiments, the substrate 812 is substantially free of active and passive devices.

The substrate 812 may have bond pads 810 on a first side of the substrate 812 to couple to the stacked dies 802, and bond pads 816 on a second side of the substrate 812, the second side being opposite the first side of the substrate 812, to couple to the conductive connectors 818. In some embodiments, the bond pads 810 and 816 are formed by forming recesses (not shown) into dielectric layers (not shown) on the first and second sides of the substrate 812. The recesses may be formed to allow the bond pads 810 and 816 to be embedded into the dielectric layers. In other embodiments, the recesses are omitted as the bond pads 810 and 816 may be formed on the dielectric layer. In some embodiments, the bond pads 810 and 816 include a thin seed layer (not shown) made of copper, titanium, nickel, gold, palladium, the like, or a combination thereof. The conductive material of the bond pads 810 and 816 may be deposited over the thin seed layer. The conductive material may be formed by an electrochemical plating process, an electroless plating process, CVD, atomic layer deposition (ALD), PVD, the like, or a combination thereof. In an embodiment, the conductive material of the bond pads 810 and 816 is copper, tungsten, aluminum, silver, gold, the like, or a combination thereof.

In some embodiments, the bond pads 810 and the bond pads 816 are UBMs that include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the bond pads 810 and 816. Any suitable materials or layers of material that may be used for the bond pads 810 and 816 are fully intended to be included within the scope of the current application. In some embodiments, the conductive vias 814 extend through the substrate 812 and couple at least one of the bond pads 810 to at least one of the bond pads 816.

In the illustrated embodiment, the stacked dies 802 are coupled to the substrate 812 by wire bonds 806, although other connections may be used, such as conductive bumps. In an embodiment, the stacked dies 802 are stacked memory dies. For example, the stacked dies 802 may be memory dies such as low-power (LP) double data rate (DDR) memory modules, such as LPDDR1, LPDDR2, LPDDR3, LPDDR4, or the like memory modules.

The stacked dies 802 and the wire bonds 806 may be encapsulated by a molding material 808. The molding material 808 may be molded on the stacked dies 802 and the wire bonds 806, for example, using compression molding. In some embodiments, the molding material 808 is a molding compound, a polymer, an epoxy, silicon oxide filler material, the like, or a combination thereof. A curing process may be performed to cure the molding material 808; the curing process may be a thermal curing, a UV curing, the like, or a combination thereof. Subsequently, the coupled third package component Boo and the second package component 700, are mounted to a package substrate 600 (described previously in FIG. 20) using the conductive connectors 602 in a similar manner as described above FIG. 20.

Figure 22:
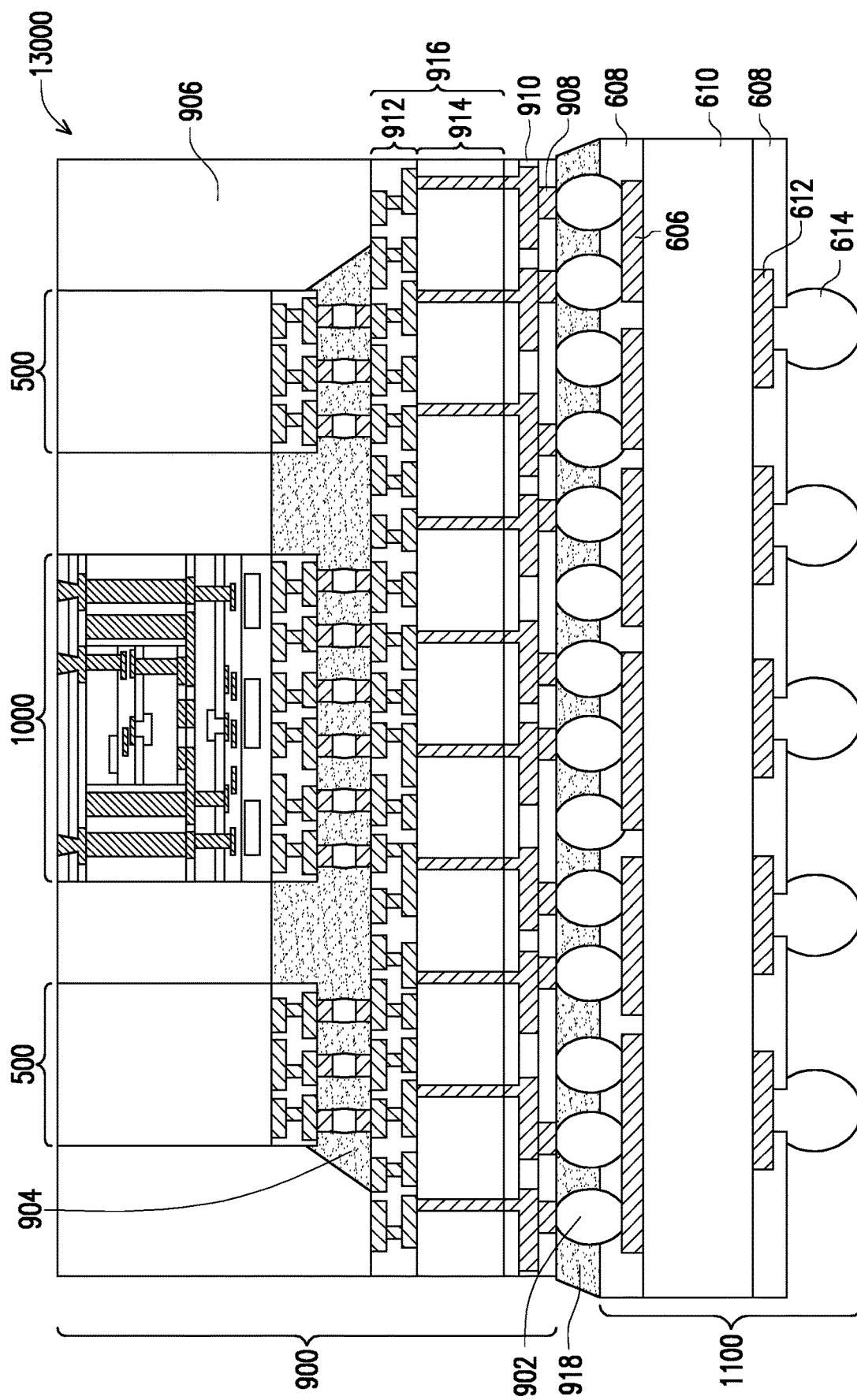
FIG. 22 illustrates a cross-sectional view of a package 13000 in accordance with an alternate embodiment.
Figure 23:
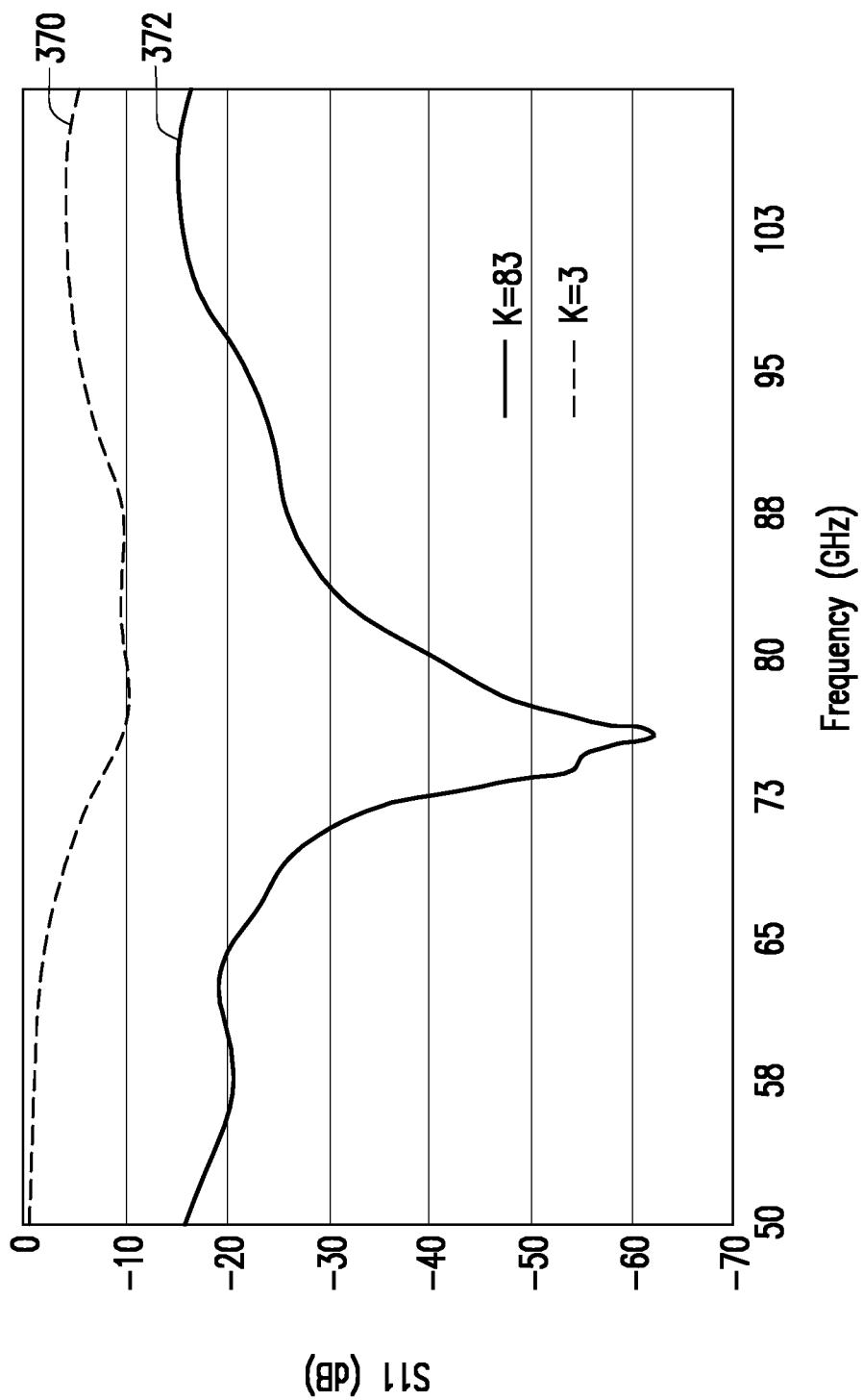
FIG. 23 illustrates a schematic diagram of a simulation result for different insulating materials, in accordance with some embodiments.

FIG. 22 illustrates a cross-sectional view of a package 13000, in accordance with some embodiments. Unless specified otherwise, like reference numerals in this embodiment (and subsequently discussed embodiments) represent like components in the embodiment shown in FIGS. 1 through 22 formed by like processes. Accordingly, the process steps and applicable materials may not be repeated herein. One or more integrated circuit dies 500 and one or more of any of the packages 1000 through 10000 shown previously in FIGS. 1 through 19B are packaged to form an integrated circuit package. The integrated circuit package may also be referred to as a chip-on-wafer-on-substrate (CoWoS) package.

In FIG. 22, a fourth package component 900 is shown which may include one or more devices designed for an intended purpose such as a memory die (e.g., a DRAM die, a stacked memory die, a high-bandwidth memory (HBM) die, etc.), a logic die, a central processing unit (CPU) die, an I/O die, a system-on-a-chip (SoC), a component on a wafer (CoW), an integrated fan-out structure (InFO), a package, a radio frequency (RF) die, the like, or a combination thereof. In an embodiment, the fourth package component 900 includes integrated circuit devices, such as transistors, capacitors, inductors, resistors, metallization layers, conductive connectors, and the like, therein, as desired for a particular functionality. In some embodiments, the fourth package component 900 may include more than one of the same type of device, or may include different devices. FIG. 22 shows the fourth package component 900 comprising at least one of the packages 1000 (described earlier in FIGS. 1 through 10) and two integrated circuit dies 500 (described earlier in FIG. 20) which are encapsulated and connected with redistribution structures and contact pads. In other embodiments, the fourth package component 900 may comprise more than one of each of the packages 1000 and the integrated circuit dies 500. In an embodiment, the one or more packages 1000 may be replaced by one or more of the packages 2000 through 10000 shown previously in FIGS. 11A through 19B.

The package 1000 and the integrated circuit dies 500 are attached to the interposer 916. The interposer 916 may include a substrate 914 and a interconnect structure 912. The fourth package component 900 may comprise an underfill material 904 dispensed between the package 1000 and the integrated circuit dies 500, and the interconnect structure 912. In some embodiments, the fourth package component 900 may comprise an encapsulant 906 that surrounds the package 1000 and the integrated circuit dies 500.

Still referring to FIG. 22, a package substrate 1100 is shown. The package substrate 1100 includes a substrate core 610 and bond pads 606 over the substrate core 610. The substrate core 610 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 610 may be an SOI substrate. Generally, an SOI substrate includes a layer of a semiconductor material such as epitaxial silicon, germanium, silicon germanium, SOI, SGOI, or combinations thereof. The substrate core 610 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for substrate core 610.

The substrate core 610 may include active and passive devices (not shown). A wide variety of devices such as transistors, capacitors, resistors, combinations of these, and the like may be used to generate the structural and functional requirements of the design for the device stack. The devices may be formed using any suitable methods.

The substrate core 610 may also include metallization layers and vias (not shown), with the bond pads 606 being physically and/or electrically coupled to the metallization layers and vias. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material and may be formed through any suitable process (such as deposition, damascene, dual damascene, or the like). In some embodiments, the substrate core 610 is substantially free of active and passive devices.

In some embodiments, the package substrate 1100 may comprise conductive connectors 902. The conductive connectors 902 may be coupled to the bond pads 606. The conductive connectors 902 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 902 may include a conductive material such as solder, copper, aluminum, gold, nickel, silver, palladium, tin, the like, or a combination thereof. In some embodiments, a solder resist 608 is formed on the substrate core 610 and the conductive connectors 902 may be disposed in openings in the solder resist 608 to be electrically and mechanically coupled to the bond pads 606. The solder resist 608 may be used to protect areas of the substrate core 610 from external damage.

The fourth package component 900 is placed on conductive connectors 902 of the package substrate 1100, making electrical connection between the fourth package component 900 and the package substrate 1100. The fourth package component 900 may be placed such that conductive bumps 908 are aligned with the conductive connectors 902 of the package substrate 1100. Once in physical contact, a reflow process may be utilized to bond the conductive connectors 902 of the package substrate 1100 to the fourth package component 900. An underfill 918 may then be formed between the fourth package component 900 and the package substrate 1100, surrounding the conductive connectors 902.

In an embodiment, the package substrate 1100 may comprise bond pads 612 over the substrate core 610. Conductive connectors 614 may be coupled to the bond pads 612 to allow for the electrical coupling of the package substrate 1100 to external circuits or devices. The conductive connectors 614 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 614 may include a conductive material such as solder, copper, aluminum, gold, nickel, silver, palladium, tin, the like, or a combination thereof. In some embodiments, the solder resist 608 is formed on the substrate core 610 and the conductive connectors 614 may be disposed in openings in the solder resist 608 to be electrically and mechanically coupled to the bond pads 612. The solder resist 608 may be used to protect areas of the substrate core 610 from external damage.

In FIG. 23, a schematic diagram of a simulation result for different insulating materials is shown, in accordance with some embodiments. The antenna configuration for the simulation is similar to the structure shown in FIG. 9 with the resonance frequency set at about 77 GHz. Two different insulating film materials are simulated and the performances of their S-parameters S11 (generic representation of a signal return loss) are compared. Referring to FIG. 23, a line 370 and a line 372 represent the simulation results for the materials with dielectric constants of around 3.0 and 83, respectively. As shown in FIG. 23, the first material with a dielectric constant of 3.0 exhibits a return loss in a range from −10 dB to 0 dB with a local minimum at around 75-88 GHz. In contrast, the second dielectric material with a dielectric constant of 83 exhibits a signal loss in a range from −62 dB to −23 dB. Specifically, the second dielectric material provides a sharper frequency selectivity gain at a valley around 76 GHz.

The embodiments of the present disclosure have some advantageous features. The embodiments include the formation of a system on integrated chip (SoIC) package comprising vertical Through Dielectric Via (TDV) walls and TDV gratings to form an antenna oscillation cavity. The TDV walls and TDV gratings can be formed having varied heights and varied widths. In addition, the spacing between two adjacent vertical TDV walls may be varied, and the spacing between two adjacent vertical TDV gratings may also be varied. Advantageous features of one or more embodiments disclosed herein may allow for high-frequency lateral Radio Frequency (RF) transmission suitable for 5G & 6G high-frequency (e.g., 29, 38, 77, and 120 GHz) RF transceivers, as well as portable, wearable, IoT (internet of things) and smart phone products. In addition, the thin plated TDV walls and TDV gratings can act as an embedded SoIC high-frequency RF emission and receiving antenna structures. Further, since the formation process of the TDV walls and the TDV gratings is compatible with current processes, manufacturing costs are reduced and efficiency is increased.

In accordance with an embodiment, a package structure includes a first die; a second die over and electrically connected to the first die; an insulating material around the second die; a first antenna extending through the insulating material and electrically connected to the second die, the first antenna being adjacent to a first sidewall of the second die, where the first antenna includes a first conductive plate extending through the insulating material; and a plurality of first conductive pillars extending through the insulating material, where the first conductive plate is between the plurality of first conductive pillars and the first sidewall of the second die. In an embodiment, the dielectric constant of the insulating material is in a range from 3.9 to 4.2. In an embodiment, the insulating material separates adjacent ones of the plurality of first conductive pillars. In an embodiment, a major surface of the first conductive plate and a major surface of each first conductive pillar of the plurality of first conductive pillars is disposed in a plane that is perpendicular to a major surface of the first die. In an embodiment, the package structure further includes a redistribution structure over the insulating material, the second die, and the first antenna; first conductive connectors over the redistribution structure, the first conductive connectors being electrically connected to the first antenna through the redistribution structure; and second conductive connectors over the redistribution structure, the second conductive connectors being electrically connected to the first die through the second die and the redistribution structure. In an embodiment, the package structure further includes a second antenna extending through the insulating material and electrically connected to the second die, the second antenna being adjacent to a second sidewall of the second die, where the second antenna includes a second conductive plate extending through the insulating material; and a plurality of second conductive pillars extending through the insulating material, where the second conductive plate is between the plurality of second conductive pillars and the second sidewall of the second die. In an embodiment, the package structure further includes a third antenna extending through the insulating material and electrically connected to the second die, the third antenna being adjacent to a third sidewall of the second die; and a fourth antenna extending through the insulating material and electrically connected to the second die, the fourth antenna being adjacent to a fourth sidewall of the second die. In an embodiment, the first sidewall and the second sidewall are parallel to each other. In an embodiment, the first sidewall and the second sidewall are perpendicular to each other.

In accordance with an embodiment, a package includes a first package structure over and electrically connected to a first redistribution structure, where the first package structure includes a first die over and electrically connected to a second die; an insulating material encapsulating the first die; a first antenna including a first portion extending through the insulating material to a feed line between the first die and the second die; and a third die over and electrically connected to the first redistribution structure; and a first encapsulant surrounding the first package structure and the third die. In an embodiment, the first portion of the first antenna includes a first conductive plate. In an embodiment, a second portion of the first antenna extends through the insulating material, the second portion of the first antenna including a conductive mesh. In an embodiment, a third portion of the first antenna extends through the insulating material, the third portion of the first antenna including a plurality of conductive pillars. In an embodiment, the feed line electrically connects the first conductive plate to the first die and the second die. In an embodiment, the package includes a second redistribution structure over the first package structure; a second package structure over and bonded to the second redistribution structure, through first conductive connectors, where the first package structure and the second package structure are electrically connected through the first conductive connectors and the second redistribution structure. In an embodiment, the second package structure includes a first substrate; a plurality of stacked dies over the first substrate; and a second encapsulant surrounding plurality of stacked dies In accordance with an embodiment, a method includes bonding a first die to a second die, where bonding the first die to the second die includes bonding a feed line and first conductive pad of the second die to second conductive pads of the first die; depositing an insulating material to surround the first die; etching first openings in the insulating material to expose the first conductive pad of the second die, and etching a second opening in the insulating material to expose the feed line; and depositing a conductive material in the first openings and the second opening to form a plurality of first conductive pillars in the first openings and a first conductive plate in the second opening. In an embodiment, the method further includes forming a redistribution structure over the insulating material, the first die, the plurality of first conductive pillars, and the first conductive plate; forming first conductive connectors over the redistribution structure, the first conductive connectors being electrically connected to the plurality of first conductive pillars through the redistribution structure; and forming second conductive connectors over the redistribution structure, the second conductive connectors being electrically connected to the second die through the first die and the feed line. In an embodiment, the dielectric constant of the insulating material is in a range from 3.9 to 4.2. In an embodiment, the second opening is between a sidewall of the first die and the first openings.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    bonding a first die to a second die, wherein bonding the first die to the second die comprises bonding a feed line and first conductive pad of the second die to second conductive pads of the first die;
    depositing an insulating material to surround the first die;
    etching first openings in the insulating material to expose a third conductive pad of the second die, and etching a second opening in the insulating material to expose the feed line; and
    depositing a conductive material in the first openings and the second opening to form a plurality of first conductive pillars in the first openings and a first conductive plate in the second opening.

2. The method of claim 1, further comprising:
    forming a redistribution structure over the insulating material, the first die, the plurality of first conductive pillars, and the first conductive plate;
    forming first conductive connectors over the redistribution structure, the first conductive connectors being electrically connected to the plurality of first conductive pillars through the redistribution structure; and
    forming second conductive connectors over the redistribution structure, the second conductive connectors being electrically connected to the second die through the first die and the feed line.

3. The method of claim 1, wherein the dielectric constant of the insulating material is in a range from 3.9 to 4.2.

4. The method of claim 1, wherein depositing the insulating material comprises performing a CVD process using tetra-ethyl-Ortho-silicate (TEOS) and oxygen as a precursor.

5. The method of claim 4, wherein the insulating material comprises silicon oxide.

6. The method of claim 1, wherein the second opening is between a sidewall of the first die and the first openings.

7. The method of claim 1, further comprising:
    after depositing the conductive material in the first openings and the second opening, performing a planarization process to level top surfaces of the conductive material with top surfaces of the insulating material and a top surface of the first die.

8. A method comprising:
    bonding a top die to a bottom die, wherein bonding the top die to the bottom die comprises:
        bonding a first conductive pad of the bottom die to a second conductive pad of the top die;
        bonding a first feed line of the bottom die to a third conductive pad of the top die; and
        bonding a second feed line of the bottom die to a fourth conductive pad of the top die;
    encapsulating the top die with a dielectric material;
    forming a plurality of first conductive pillars that extend through the dielectric material, the plurality of first conductive pillars being electrically connected to a fifth conductive pad of the bottom die; and
    forming a first conductive plate that extends through the dielectric material, the first conductive plate being electrically connected to the first feed line, and wherein the plurality of first conductive pillars and the first conductive plate are adjacent to a first sidewall of the top die.

9. The method of claim 8, wherein the first conductive plate is disposed between the plurality of first conductive pillars and the first sidewall of the top die.

10. The method of claim 8, wherein the first conductive plate and the plurality of first conductive pillars comprise copper, silver, platinum, gold, nickel, or tin.

11. The method of claim 8, further comprising:
    forming a plurality of second conductive pillars that extend through the dielectric material; and
    forming a second conductive plate that extends through the dielectric material, the second conductive plate being electrically connected to the second feed line, and wherein the plurality of second conductive pillars and the second conductive plate are adjacent to a second sidewall of the top die.

12. The method of claim 11, wherein the second conductive plate is disposed between the plurality of second conductive pillars and the second sidewall of the top die.

13. The method of claim 11, wherein the first sidewall of the top die and the second sidewall of the top die are parallel to each other.

14. The method of claim 11, wherein the first sidewall of the top die and the second sidewall of the top die are perpendicular to each other.

15. A method comprising:
    bonding a first die to a second die, wherein bonding the first die to the second die comprises forming an oxide-to-oxide bond between a first bonding layer of the first die and a second bonding layer of the second die;

depositing a dielectric material over the second die and around the first die;

forming a first conductive plate extending through the dielectric material and in physical contact with a first feed line of the second die, wherein the first feed line is electrically connected to the first die; and forming a first conductive grating extending through the dielectric material and electrically connected to the second die, wherein the first conductive plate and the first conductive grating are adjacent to a first sidewall of the first die.

16. The method of claim 15, wherein the first conductive plate is disposed between the first conductive grating and the first sidewall of the first die.

17. The method of claim 16, wherein the first conductive grating comprises a conductive mesh.

18. The method of claim 15, further comprising:

forming a second conductive plate extending through the dielectric material and in physical contact with a second feed line of the second die, wherein the second feed line is electrically connected to the first die; and forming a second conductive grating extending through the dielectric material and electrically connected to the second die, wherein the second conductive plate and the second conductive grating are adjacent to a second sidewall of the first die.

19. The method of claim 18, further comprising:

forming a third conductive plate extending through the dielectric material and in physical contact with a third feed line of the second die, wherein the third feed line is electrically connected to the first die; and forming a third conductive grating extending through the dielectric material and electrically connected to the second die, wherein the third conductive plate and the third conductive grating are adjacent to a third sidewall of the first die.

20. The method of claim 15, wherein a distance between a sidewall of the first conductive grating and a sidewall of the first conductive plate that faces the sidewall of the first conductive grating is in a range from 10 μm to 9990 μm.

* * * * *